United States Patent
Chen

(10) Patent No.: US 8,400,203 B1
(45) Date of Patent: Mar. 19, 2013

(54) INTEGRATED CIRCUIT WITH DELAY CIRCUITRY

(75) Inventor: Chung-Kuang Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 13/240,654

(22) Filed: Sep. 22, 2011

(51) Int. Cl.
*H03K 3/00* (2006.01)

(52) U.S. Cl. ......... 327/293; 327/129; 327/295; 327/296

(58) Field of Classification Search ................. 327/165, 327/166, 291–299, 374, 178; 326/93–98; 716/6
See application file for complete search history.

(56) References Cited

U.S. PATENT DOCUMENTS

| | | | |
|---|---|---|---|
| 7,075,353 B1 | 7/2006 | Wan et al. | |
| 7,142,005 B1 | 11/2006 | Gaboury | |
| 7,459,952 B2 | 12/2008 | Ogita | |
| 7,961,027 B1 | 6/2011 | Chen et al. | |
| 2007/0103221 A1* | 5/2007 | Ogita | 327/291 |
| 2010/0033153 A1* | 2/2010 | Xing et al. | 323/288 |
| 2010/0315148 A1* | 12/2010 | Zhu et al. | 327/298 |
| 2011/0215837 A1* | 9/2011 | Li et al. | 326/95 |

* cited by examiner

*Primary Examiner* — Lincoln Donovan
*Assistant Examiner* — Brandon S Cole
(74) *Attorney, Agent, or Firm* — Kenta Suzue; Haynes Beffel & Wolfield LLP

(57) ABSTRACT

The delay circuit, such as a clock circuit, of an integrated circuit operates with tolerance of variation in temperature. For example, the delay circuit has a temperature dependent current generator that has an adjustable temperature coefficient, such that a range of temperature coefficients is selectable at a particular current output. Also, the clock circuit of an integrated circuit operates with multiple versions of a current that controls a discharging rate and/or a charging rate between reference signals of timing circuitry.

27 Claims, 21 Drawing Sheets

INTEGRATED CIRCUIT WITH DELAY CIRCUITRY

BACKGROUND

1. Field of the Invention

The present technology relates to an integrated circuit with a clock circuit, tolerant to variations such as temperature and power.

2. Description of Related Art

The clock circuit of an integrated circuit operates with variations such as temperature and power. Because these variations affect the final timing of the output clock signal, various approaches address the variations in order to generate a uniform output clock signal despite the variations.

For example, the clock circuit of an integrated circuit relies on a reference signal generated by a combination of a voltage pump generating a high voltage in excess of a voltage supply, and a voltage regulator. Such circuitry consumes a great deal of layout area, and also consumes high current.

What is needed is an approach to address such variations with reduced complexity and cost.

SUMMARY

One aspect of the technology is a integrated circuit with delay circuitry, generating a clock signal. The integrated circuit with delay circuitry includes timing circuitry, a current generating block, a plurality of current mirroring blocks, and a level switching circuit.

The timing circuitry has an output alternating between reference signals.

The current generating block has an output current that controls at least one of: (i) a discharging rate between the reference signals, and (ii) a charging rate between the reference signals.

The plurality of current mirroring blocks generate multiple versions of the output current of the current generating block. The multiple versions control at least one of the discharging rate and the charging rate at different parts of the timing circuitry.

The level switching circuit is coupled to the output of the timing circuitry. The level switching circuit has an output that determines the clock signal of the integrated circuit with delay circuitry. The output of the level switching circuit switches output levels in response to the output of the timing circuitry reaching a trigger point of the level switching circuit.

In one embodiment, the timing circuitry and the level switching circuit determine timing of the clock signal.

In various embodiments, the output current of the current generating block includes at least a circuit power compensated component and a temperature compensated component.

In some such embodiments with the temperature compensated component, the temperature compensated component has a tunable temperature coefficient. In some such embodiments with a tunable temperature coefficient, the temperature compensated component at a particular current value has a range of tunable temperature coefficients. In some such embodiments with a tunable temperature coefficient, the tunable temperature coefficient includes at least one of a temperature dependent voltage component proportional to temperature and a temperature dependent voltage component conversely proportional to temperature and a temperature independent component.

In some such embodiments with a temperature compensated component, the temperature compensated component has a tunable temperature coefficient, and the tunable temperature coefficient includes a temperature dependent voltage component adjusted by a factor greater than 1.

In some such embodiments with a temperature compensated component, the temperature compensated component has a tunable temperature coefficient, and the tunable temperature coefficient includes a temperature dependent voltage component adjusted by a factor less than 1.

In some such embodiments with the circuit power compensated component, the circuit power component has a tunable power coefficient. In some such embodiments with a tunable power coefficient, the circuit power compensated component at a particular current value has a range of tunable power coefficients. In some such embodiments with a tunable power coefficient, the tunable power coefficient includes at least one of a power dependent component proportional to circuit power and a power dependent component conversely proportional to circuit power and a power independent component.

In some such embodiments with a power compensated component, the power compensated component has a tunable power coefficient, and the tunable power coefficient includes a power dependent component adjusted by a factor greater than 1.

In some such embodiments with a power compensated component, the power compensated component has a tunable power coefficient, and the tunable power coefficient includes a power dependent component adjusted by a factor less than 1.

In one embodiment, the multiple versions of the output current scale the output current.

One embodiment further includes a latch. The latch receives the output of the level switching circuitry and generates the clock signal of the integrated circuit with delay circuitry. The latch includes cross-coupled gates, such that outputs of the cross-coupled gates in the latch are coupled to inputs of different cross-coupled gates in the latch. The latch has a plurality of inputs coupled to the different parts of the timing circuitry.

Another aspect of the technology is a method of generating a clock signal from a integrated circuit with delay circuitry. The method includes the following steps:

alternating an output of timing circuitry between reference signals;

generating a current that controls at least one of (i) a discharging rate between the reference signals and (ii) a charging rate between the reference signals;

generating multiple versions of the current controlling at least one of the discharging rate and the charging rate at different parts of the timing circuitry, the multiple versions controlling at least one of the discharging rate and the charging rate at different parts of the timing circuitry; and switching output levels of level switching circuitry in response to the output of the timing circuitry reaching a trigger point of the level switching circuit, an output of the level switching circuitry determining the clock signal of the integrated circuit with delay circuitry.

In one embodiment, the timing circuitry and the level switching circuit determine timing of the clock signal.

In various embodiments, the current controlling at least one of the discharging rate and the charging rate, includes at least a voltage reference component and a temperature compensated component. In some such embodiments with the temperature compensated component, the temperature compensated component has a tunable temperature coefficient. In some such embodiments with a tunable temperature coefficient, the temperature compensated component a particular current value has a range of tunable temperature coefficients.

In some such embodiments with a tunable temperature coefficient, the tunable temperature coefficient includes at least one of a temperature dependent voltage component proportional to temperature and a temperature dependent voltage component conversely proportional to temperature.

In some such embodiments with a temperature compensated component, the temperature compensated component has a tunable temperature coefficient, and the tunable temperature coefficient includes a temperature dependent voltage component adjusted by a factor greater than 1.

In some such embodiments with a temperature compensated component, the temperature compensated component has a tunable temperature coefficient, and the tunable temperature coefficient includes a temperature dependent voltage component adjusted by a factor less than 1.

In one embodiment, the multiple versions scale the current controlling at least one of the discharging rate and the charging rate.

One embodiment further comprises, generating the clock signal of the integrated circuit with delay circuitry with a latch receiving the output of the level switching circuitry. The latch includes cross-coupled gates, such that outputs of the cross-coupled gates in the latch are coupled to inputs of different cross-coupled gates in the latch. The latch has a plurality of inputs coupled to the different parts of the timing circuitry.

Another aspect of the technology is an integrated circuit generating a plurality of delay signals. The integrated circuit includes a current generating block and a plurality of delay circuits.

The current generating block has an output current that controls at least one of: (i) a discharging rate between reference signals, and (ii) a charging rate between reference signals.

The plurality of delay circuits generate the plurality of delay signals. Each of the plurality of delay circuits includes delay circuitry, a current mirroring block, and a level switching circuit. The delay circuitry has an output switching between the reference signals. The current mirroring block generates a version of the output current of the current generating block. The version controls at least one of the discharging rate and the charging rate of the delay circuitry. The level switching circuit is coupled to the output of the delay circuitry. The level switching circuit has an output that determines a delay signal of the plurality of delay signals. The output of the level switching circuit switches output levels in response to the output of the delay circuitry reaching a trigger point of the level switching circuit.

One embodiment includes a single delay circuit.

In one embodiment, the current mirroring blocks in the plurality of delay circuits make scaled versions of the output current of the current generating block. Particular current magnitudes values of the scaled versions result in corresponding delay times of the plurality of delay signals.

In one embodiment, the integrated circuit further includes a set of memory registers controlling a magnitude of the output current of the current generating block.

In one embodiment, the set of memory registers controls delay times of the plurality of delay signals generated by the plurality of delay circuits.

In one embodiment, the integrated circuit has a test mode that outputs a clock cycle count with a total that varies with the set of memory registers.

In one embodiment, the integrated circuit has a test mode that varies the set of memory registers to compensate for different process corners during manufacture.

Various other embodiments are disclosed herein.

This application is related to U.S. patent application Ser. Nos. 12/631,661; 12/631,693; 12/631,705; and 12/834,369. All of these are incorporated by reference herein.

DETAILED DESCRIPTION

Figure 1:
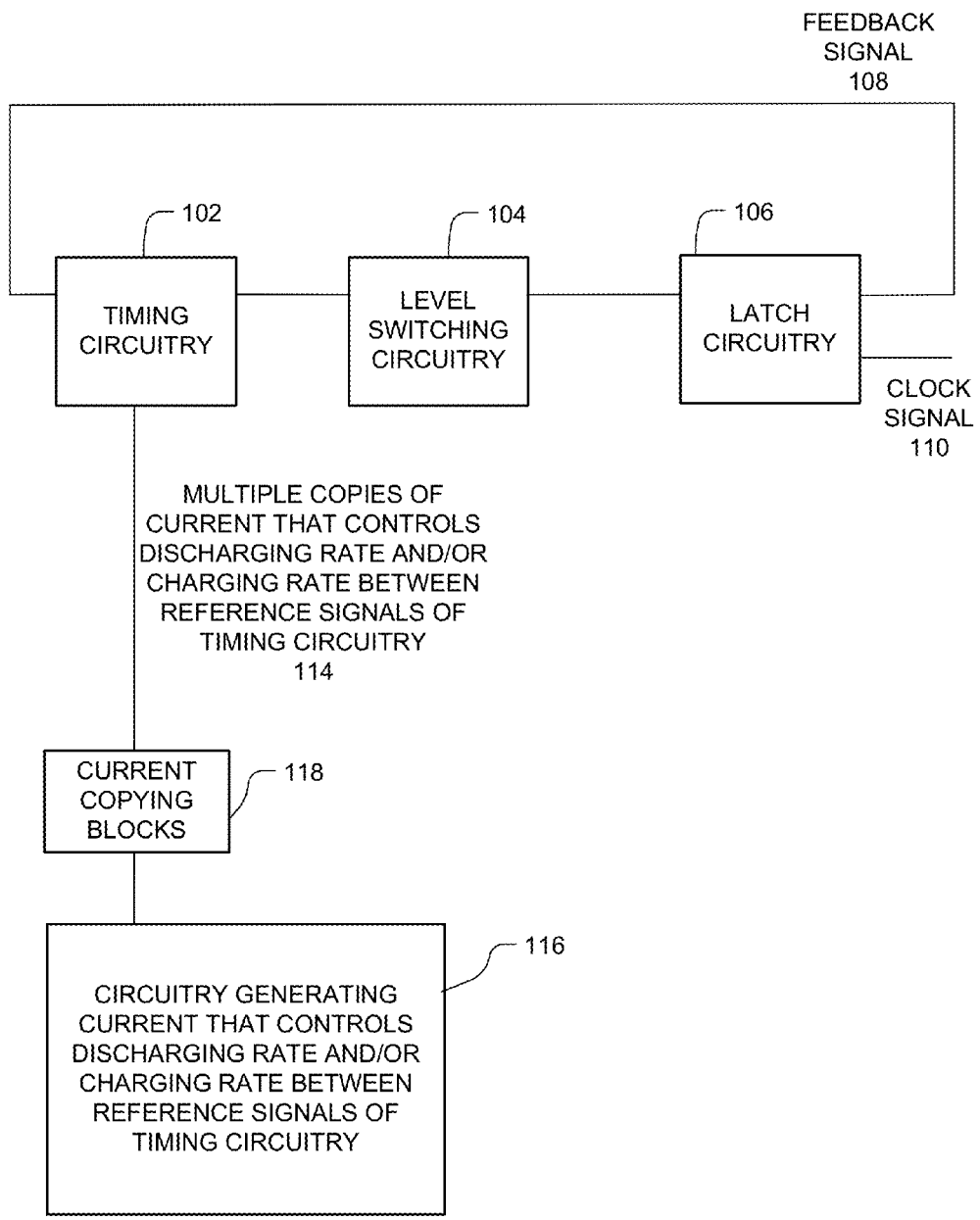
FIG. 1 is a block diagram of an integrated clock circuit that generates multiple versions of a current that controls the discharging rate and/or the charging rate between reference signals of timing circuitry.

FIG. 1 is a block diagram of an integrated clock circuit that generates multiple versions of a current that controls the discharging rate and/or the charging rate between reference signals of timing circuitry.

The integrated circuit with delay circuitry generally has a loop structure, with timing circuitry 102, level switching circuitry 104, and latch circuitry 106. The latch circuitry 106 generates a feedback signal from latch circuitry 106 back to timing circuitry 102, and the clock signal output 110. The timing circuitry 102 alternates between two reference signals, such as a supply voltage reference and a ground reference. As the timing circuitry output rises from the lower reference to the higher reference, and/or falls from the higher reference to the lower reference. The rate at which the timing circuitry output rises and/or falls, is determined by a current generated by block 116. This current generated by block 116 is copied or scaled into multiple locations of the timing circuitry 102 by the current mirroring blocks 118.

The level switching circuitry 104 monitors the output of the timing circuitry 102, and changes the output depending on whether the timing circuitry 102 is sufficiently high, or low. Examples of latch circuitry 106 are an SR latch, SR NAND latch, JK latch, gated SR latch, gated D latch, and gated toggle latch. The latch circuitry 106 has two stable states and alternates between the two stable states to generate the clock signal output 110.

Figure 2:
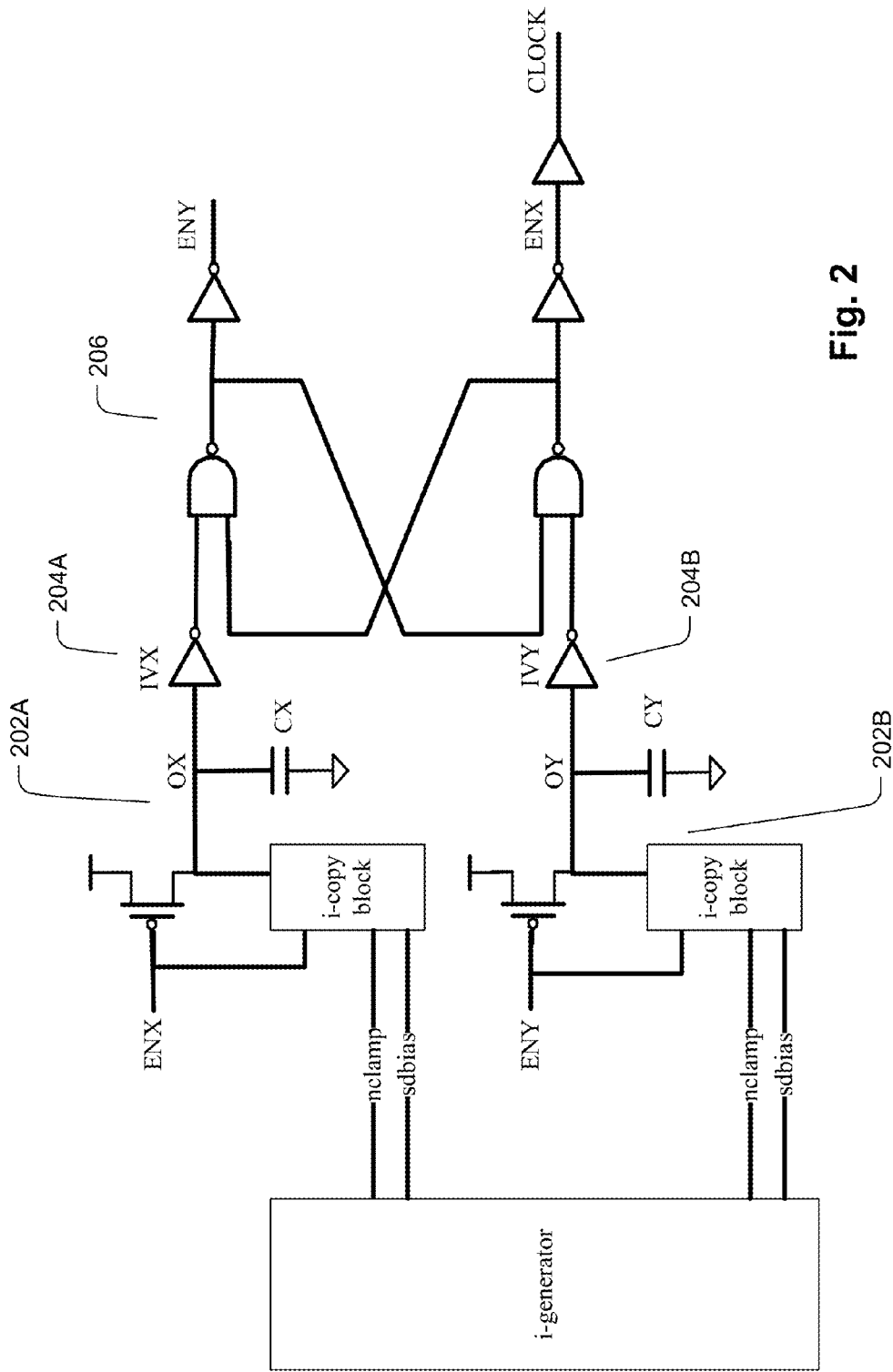
FIG. 2 is a circuit diagram of an integrated clock circuit that generates multiple versions of a current that controls the discharging rate and/or the charging rate between reference signals of timing circuitry.

FIG. 2 is a circuit diagram of an integrated clock circuit that generates multiple versions of a current that controls the discharging rate and/or the charging rate between reference signals of timing circuitry.

Shown are parallel instances of timing circuitry 202A and 202B, parallel instances of inverter circuitry 204A and 204B, and the latch circuitry 206. The timing circuitry 202A and 202B generally charges to or discharges from capacitance CX or CY, to change the output voltage at OX or OY. The rate at which the timing circuitry output rises and/or falls, is determined by a current generated by the i-generator block. This current generated by the current generator, or i-generator, block is copied or scaled into the timing circuitry 202A and 202B by the multiple current mirroring, or i-copy, blocks.

In the shown embodiment, the capacitance CX or CY is coupled to a common ground. Although all possible variations are not explicitly shown in the Figures, the present technology covers all disclosed instances of the clock circuit showing the capacitance CX or CY, where the clock circuit is modified to couple the capacitance CX or CY to ground.

In one embodiment, the capacitance CX or CY is actually a PMOS transistor with the opposite terminal decoupled from a common ground with the inverters.

In another embodiment the capacitance CX or CY is coupled to a common power. Although all possible variations are not explicitly shown in the Figures, the present technology covers all disclosed instances of the clock circuit showing the capacitance CX or CY, where the clock circuit is modified to couple the capacitance CX or CY to a common power.

The inverter circuitry 204A and 204B can be driven by circuit power source or a regulated power source which is CTAT_power (power that is conversely proportional to temperature). In another embodiment, the inverter circuitry 204A and 204B is driven by a source of PTAT_power (power that is proportional to temperature). In another embodiment, the inverter circuity 204A and 204B is driven by a source of constant power that is independent of temperature.

The inverter circuitry 204A and 204B can be driven by power source which is CTAP_power (power that is conversely proportional to circuit power). In another embodiment, the inverter circuitry 204A and 204B is driven by a source of PTAP_power (power that is proportional to circuit power). In another embodiment, the inverter circuitry 204A and 204B is driven by a source of constant power that is independent of circuit power.

The power of the inverter is controlled, to change the trip point of the inverter and thereby detect the timing circuit output.

The inverters are advantageous, for one or more of the following reasons: (1) low working VDD; (2) small circuit size (inverter has only 2 MOSFETs, but the op amp has 5 or more MOSFETs); (3) simple design; (4) low active current (inverter has one current path, and does not require an extra current mirror in the inverter); and (5) high speed (inverter has one stage delay).

The latch circuitry 206 is cross-coupled, such that the output of one gate is coupled to the inputs of the other gate. One input of a gate is directly coupled to the output of another gate. Another input of a gate is directly coupled to the output of another gate through the timing circuitry and the level detection circuitry.

Figure 3:
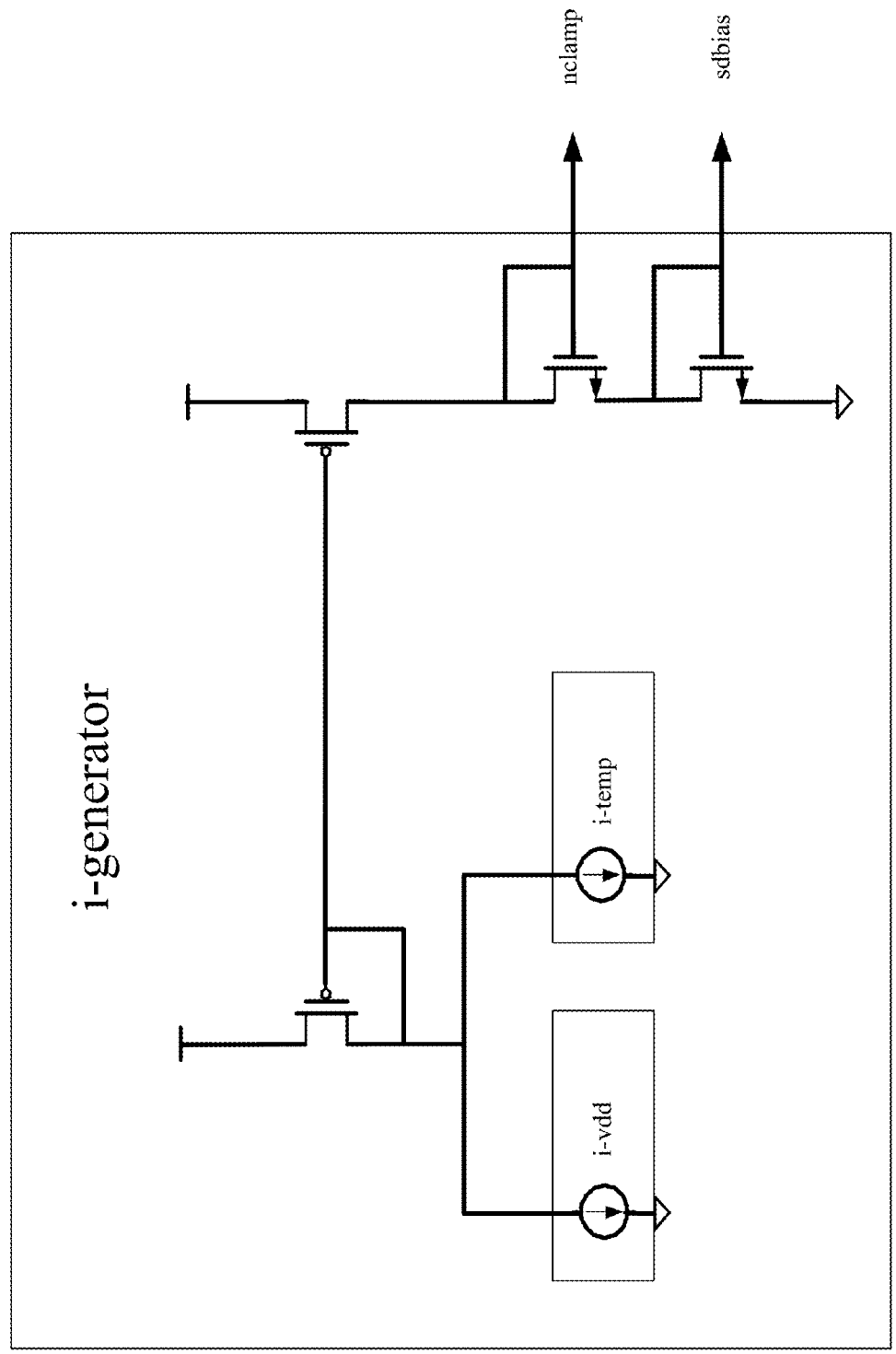
FIG. 3 is a circuit diagram of the current generating circuit, which generates a current that controls the discharging rate and/or the charging rate between reference signals of timing circuitry.

FIG. 3 is a circuit diagram of the current generating circuit, which generates a current that controls the discharging rate and/or the charging rate between reference signals of timing circuitry.

The current generating circuit, or the i-generator, has two current generating components: a voltage reference component that varies with supply voltage (e.g., proportionally or conversely proportionally) and a temperature compensated component that varies with temperature proportionally or conversely proportionally.

Accordingly, FIG. 3 shows (i) the i-vdd current source (varying with supply voltage) and (ii) the i-temp current source (varying with temperature). The output of the current generating circuit sums these two current components and outputs the sum to the current mirroring, or i-copy, block. The output has as shown, has multiple transistors connected in series between the current mirror and the ground reference. The multiple transistors connected in series have as respective outputs nclamp, and sdbias. The sdbias signal is the current mirror output signal, and nclamp is a cascade signal for a cascade circuit design. Selected transistors can be eliminated, such as removing nclamp, although at the cost of worse results.

The i-vdd current source indicates a circuit power source or a regulated power source CTAP power (power that is conversely proportional to circuit power), PTAP power (power that is proportional to circuit power), or a source of constant power that is independent of circuit power.

Figure 4:
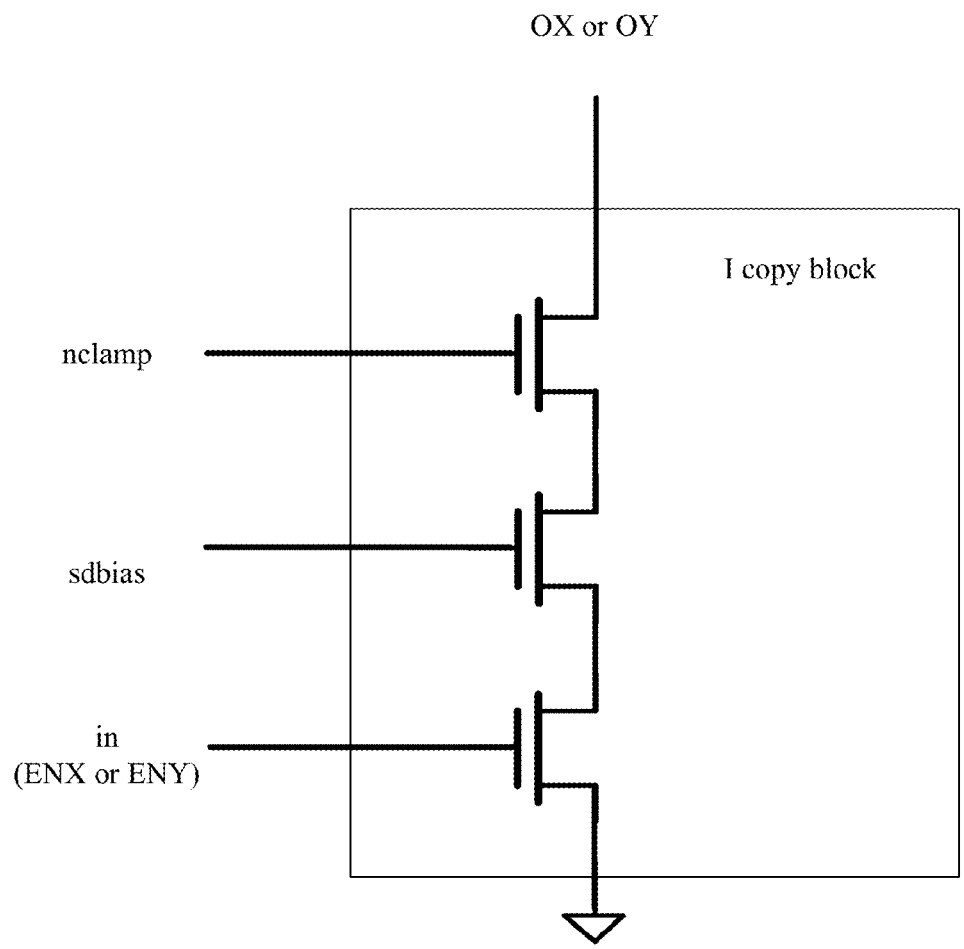
FIG. 4 is a circuit diagram of a current mirroring block, which generates a version of the current that controls the discharging rate and/or the charging rate between reference signals of timing circuitry.

FIG. 4 is a circuit diagram of a current mirroring block, which generates a version of the current that controls the discharging rate and/or the charging rate between reference signals of timing circuitry.

The transistor biases are created from the current generating, or i-generator, block, based on the output current. Accordingly, like a current mirror, the same transistor biases recreate the output current of the current generating, or i-generator, block as the output current of the current mirroring, or i-copy, block. Alternatively, the output current of the current mirroring, or i-copy, block can be scaled, such as by changing the widths of the transistors.

As shown, multiple transistors connected in series connect a ground reference with the output current terminal which leads to node OX or OY as in FIG. 1. The multiple transistors connected in series have as respective inputs nclamp, sdbias, and in (ENX or ENY). The sdbias signal is the current mirror output signal, and nclamp is a cascade signal for a cascade circuit design. Selected transistors can be eliminated, such as removing nclamp, although at the cost of worse results.

Figure 5:
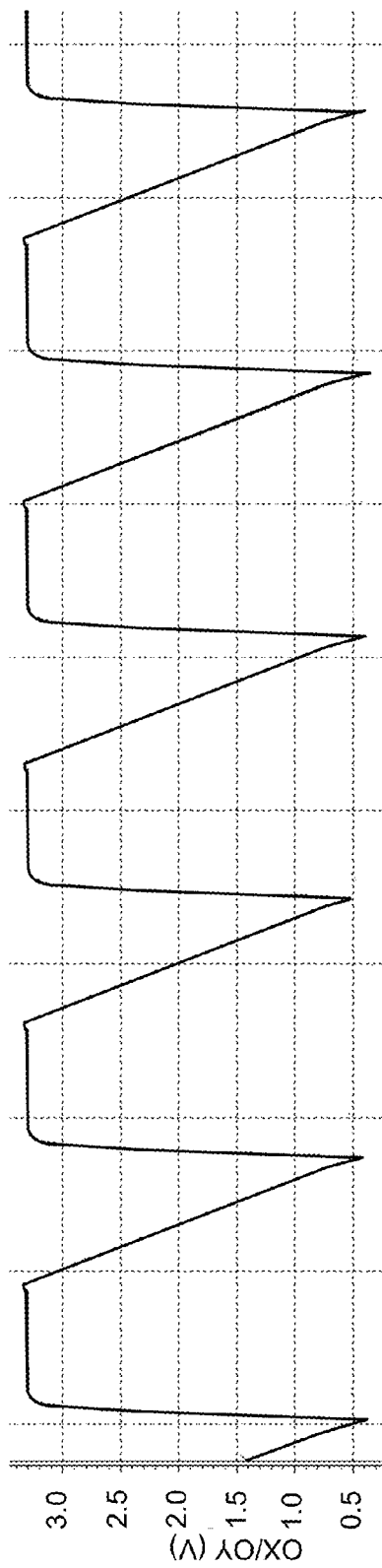
FIG. 5 is a graph showing time versus the OX node or OY node that charges or discharges according to the current that controls the discharging rate and/or the charging rate.

FIG. 5 is a graph showing time versus the OX node or OY node that charges or discharges according to the current that controls the discharging rate and/or the charging rate.

As shown, the discharge rate varies linearly, according to the output current created by the current generating, or i-generator, block; and copied or scaled (as well as optionally scaled) by the current mirroring, or i-copy, block.

Although the shown embodiments illustrate linear discharging, an alternative embodiment performs linear charging.

Figure 6:
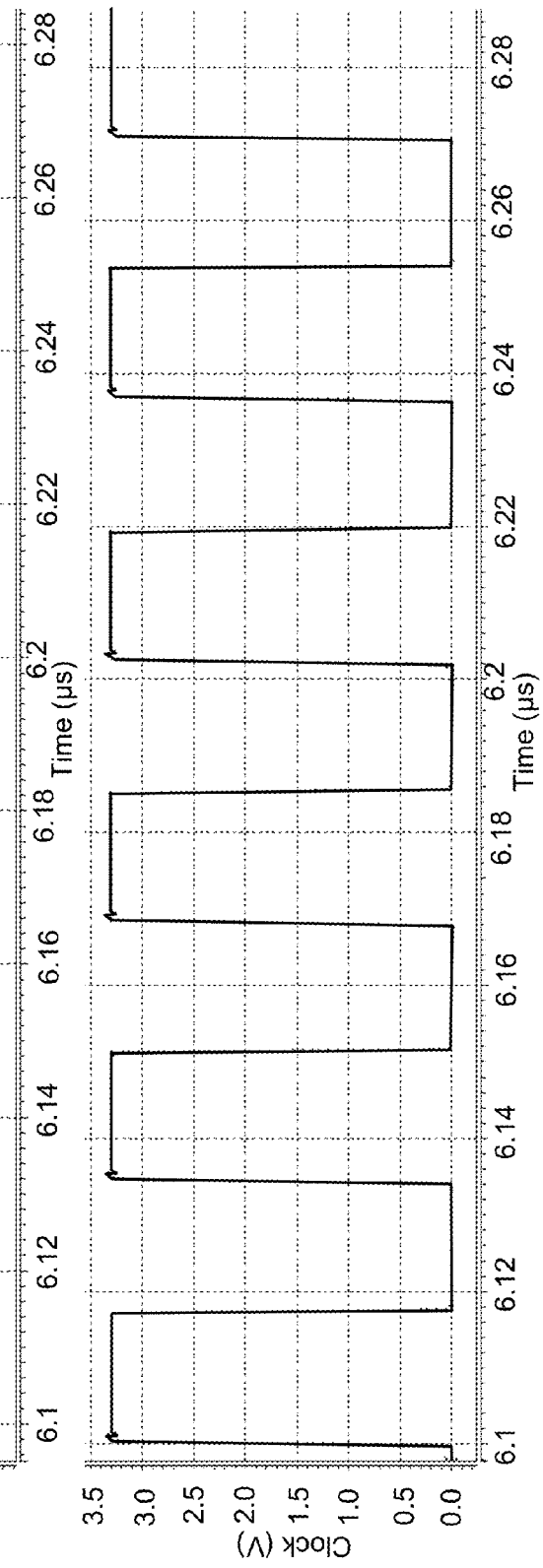
FIG. 6 is a graph showing time versus the clock voltage that is output by the integrated circuit with delay circuitry.

FIG. 6 is a graph showing time versus the clock voltage that is output by the integrated circuit with delay circuitry.

Figure 7:
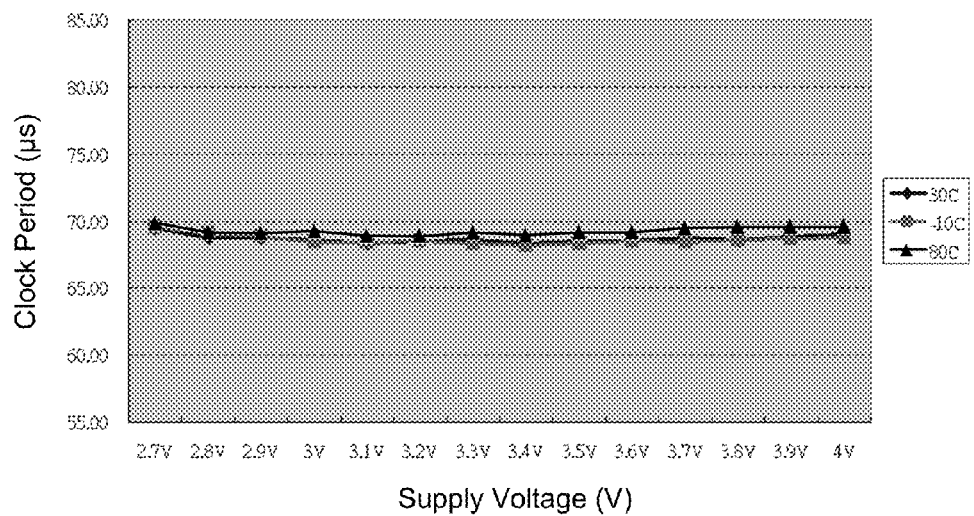
FIG. 7 is a graph showing the clock period versus the supply voltage at various temperatures.
Figure 8:
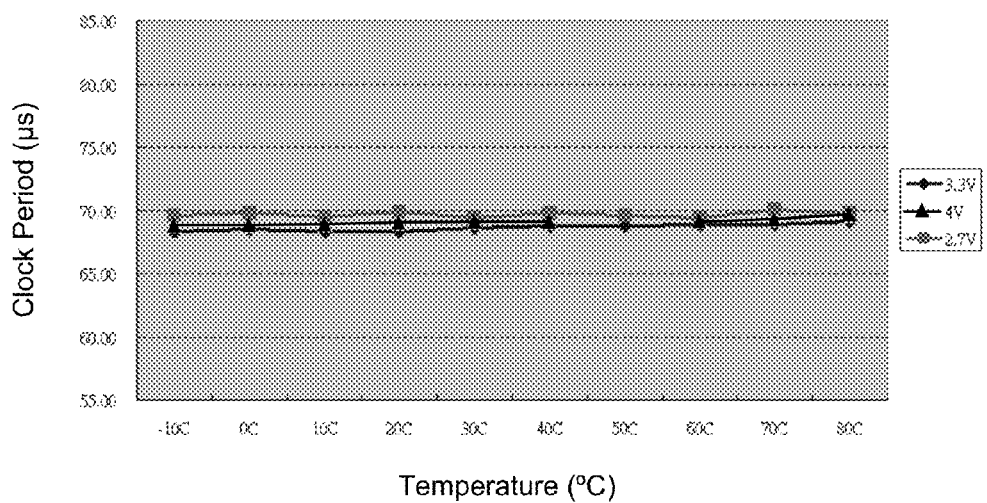
FIG. 8 is a graph showing the clock period versus temperature at various supply voltages.

FIGS. 7 and 8 show graph data highlighting the performance of the described clock circuit.

FIG. 7 is a graph showing the clock period versus the supply voltage at various temperatures.

FIG. 8 is a graph showing the clock period versus temperature at various supply voltages.

As shown in the simulation results of FIGS. 7 and 8, there is only 1.5 ns clock period variation from 70 ns over a temperature range of [−10 C~80 C] and a supply voltage range of [2.7V~4V]. This is only ±1.1% variation.

Figure 9:
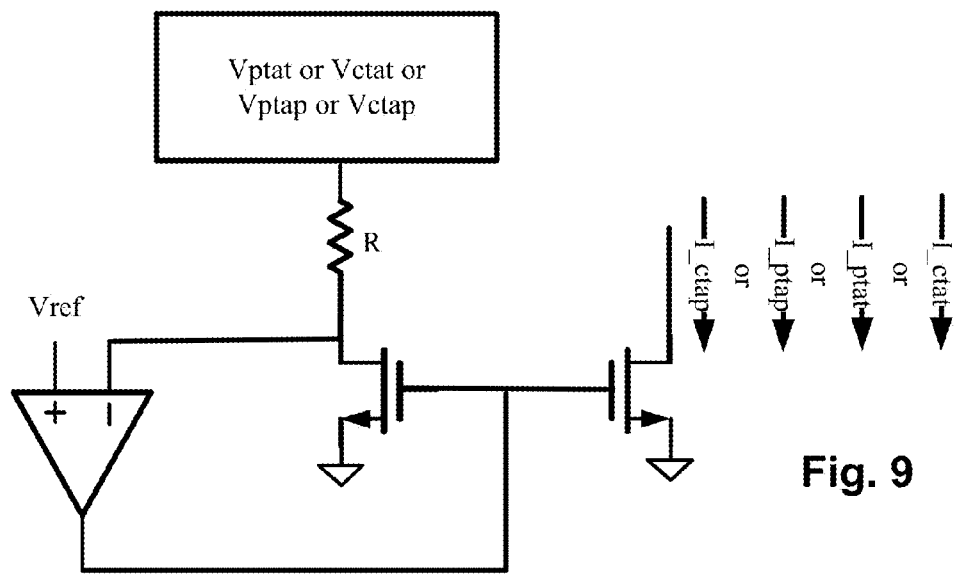
FIG. 9 is a circuit diagram of a temperature compensated current generator (part of the current generating block) without a tunable temperature coefficient at a particular current value of the temperature compensated current generator and without a tunable power coefficient.

FIG. 9 is a circuit diagram of a temperature compensated current generator (part of the current generating block) without a tunable temperature coefficient at a particular current value of the temperature compensated current generator and without a tunable power coefficient.

Below, excepting Vref, the various V1 and V2 and V refer to the Vptat or Vctat or Vptap or Vctap.

$I1=(V1-Vref)/R$ $I2=(V2-Vref)/R$ $\Delta I=I2-I1=(V2-V1)/R=\Delta V/R$ $TC=\Delta I/\Delta V=1/R, Iout=(Vptat-Vref)/R$, where $Vptat$ can also be $Vctat$ or $Vptap$ or $Vctap$ Accordingly, when tuning the temperature coefficient (TC), the resistance R and the output current need to be tuned, regardless of whether the present output current is desirable already.

Figure 10:
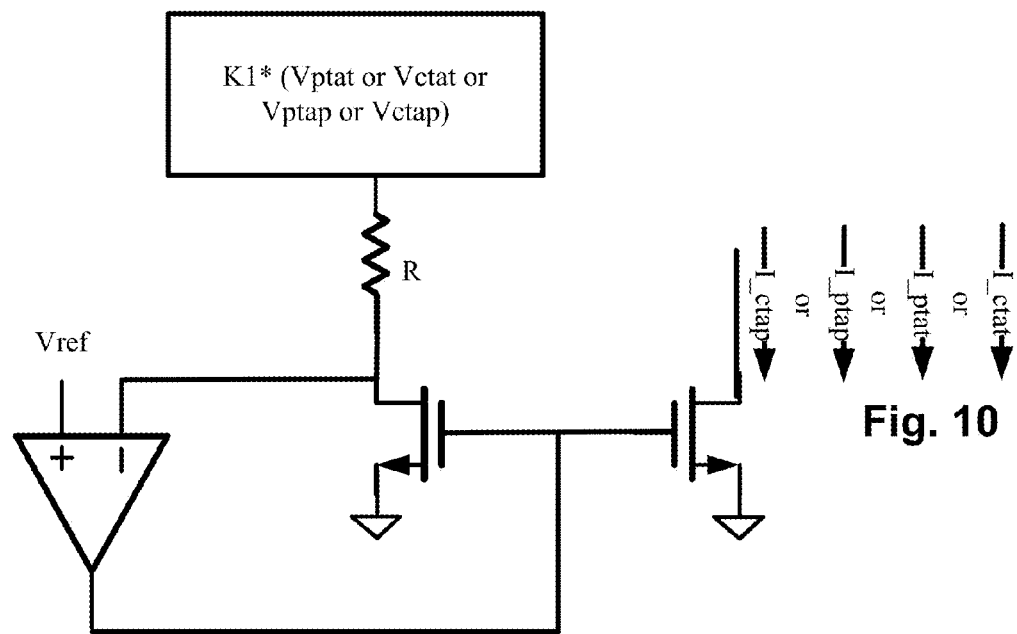
FIG. 10 is a circuit diagram of a first embodiment of a temperature compensated current generator (part of the current generating block) with a tunable temperature coefficient at a particular current value of the temperature compensated current generator and/or a tunable power coefficient.

FIG. 10 is a circuit diagram of a first embodiment of a temperature compensated current generator (part of the current generating block) with a tunable temperature coefficient at a particular current value of the temperature compensated current generator and/or a tunable power coefficient.

Below, excepting Vref, the various V1 and V2 and V refer to the Vptat or Vctat or Vptap or Vctap.

$I1=(K1*V1-Vref)/R$ $I2=(K1*V2-Vref)/R$ $\Delta I=I2-I1=K1*(V2-V1)/R=K1*\Delta V/R$ $TC=\Delta I/\Delta V=K1/R, Iout=((K1*V)-Vref)/R$ If let Iout=1, (K1*V−Vref)=R then TC=K1/((K1*V)−Vref).

So different K1 has different TC.

When tuning the temperature coefficient (TC), the K1 & R can be tuned to keep the output current in the same preferred range.

Figure 11:
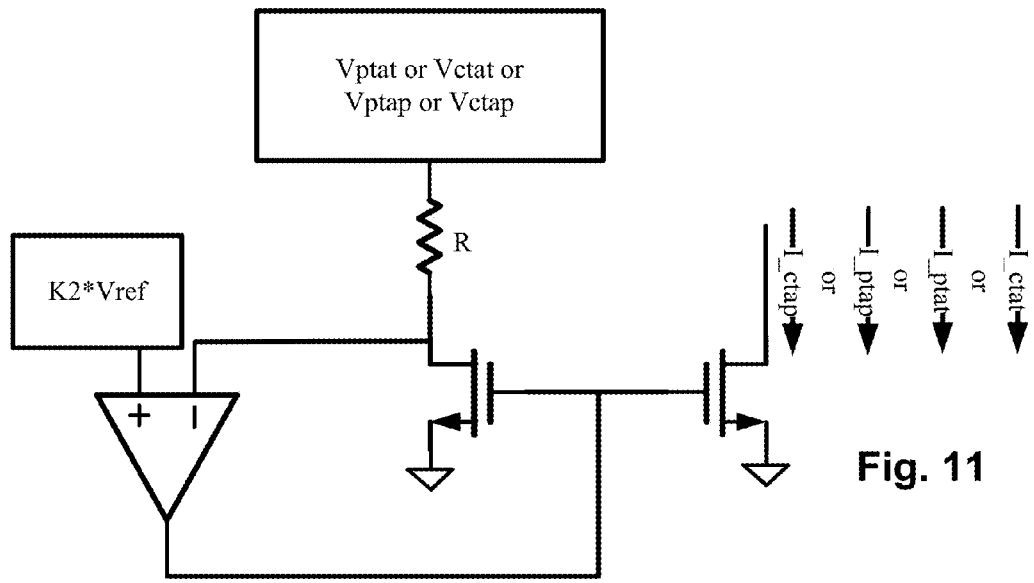
FIG. 11 is a circuit diagram of a second embodiment of a temperature compensated current generator (part of the current generating block) with a tunable temperature coefficient at a particular current value of the temperature compensated current generator and/or a tunable power coefficient.

FIG. 11 is a circuit diagram of a second embodiment of a temperature compensated current generator (part of the current generating block) with a tunable temperature coefficient at a particular current value of the temperature compensated current generator and/or a tunable power coefficient.

Below, excepting Vref, the various V1 and V2 and V refer to the Vptat or Vctat or Vptap or Vctap.

$I1=(V1-(K2*Vref))/R$ $I2=(V2-(K2*Vref)/R$ $\Delta I=I2-I1=(V2-V1)/R=\Delta V/R$ $TC=\Delta I/\Delta V=1/R, Iout=(V-(K2*Vref))/R$ So different K2 has different TC.

When tuning the temperature coefficient (TC), the K2 and R can be tuned to keep the output current in the same preferred range.

Figure 12:
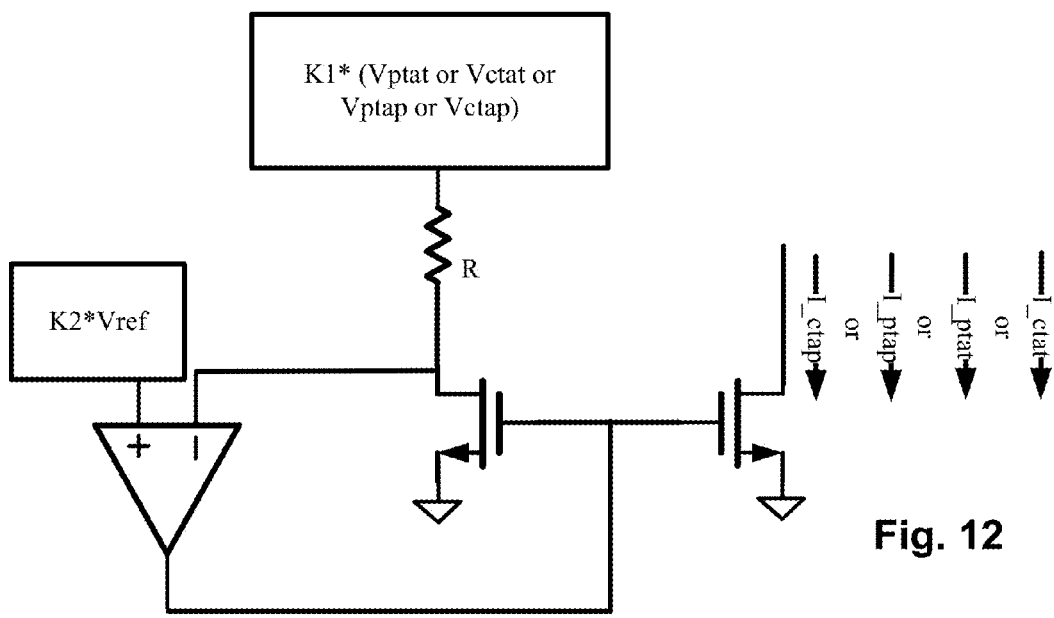
FIG. 12 is a circuit diagram of a third embodiment of a temperature compensated current generator (part of the current generating block) with a tunable temperature coefficient at a particular current value of the temperature compensated current generator and/or a tunable power coefficient.

FIG. 12 is a circuit diagram of a third embodiment of a temperature compensated current generator (part of the current generating block) with a tunable temperature coefficient at a particular current value of the temperature compensated current generator and/or a tunable power coefficient.

Below, excepting Vref, the various V1 and V2 and V refer to the Vptat or Vctat or Vptap or Vctap.

$I1=((K1*V1)-(K2*Vref))/R$ $I2=((K1*V2)-(K2*Vref))/R$ $\Delta I=I2-I1=K1*(V2-V1)/R=K1*\Delta Vptat/R$, where $\Delta Vptat$ can also be $\Delta Vctat$ or $\Delta Vptap$ or $\Delta Vctap$ $TC=\Delta I/\Delta V=K1/R, Iout=((K1*V)-(K2*Vref))/R$ When tuning the temperature coefficient (TC), the K1, K2 and R can be tuned to keep the output current in the same preferred range.

Figure 13:
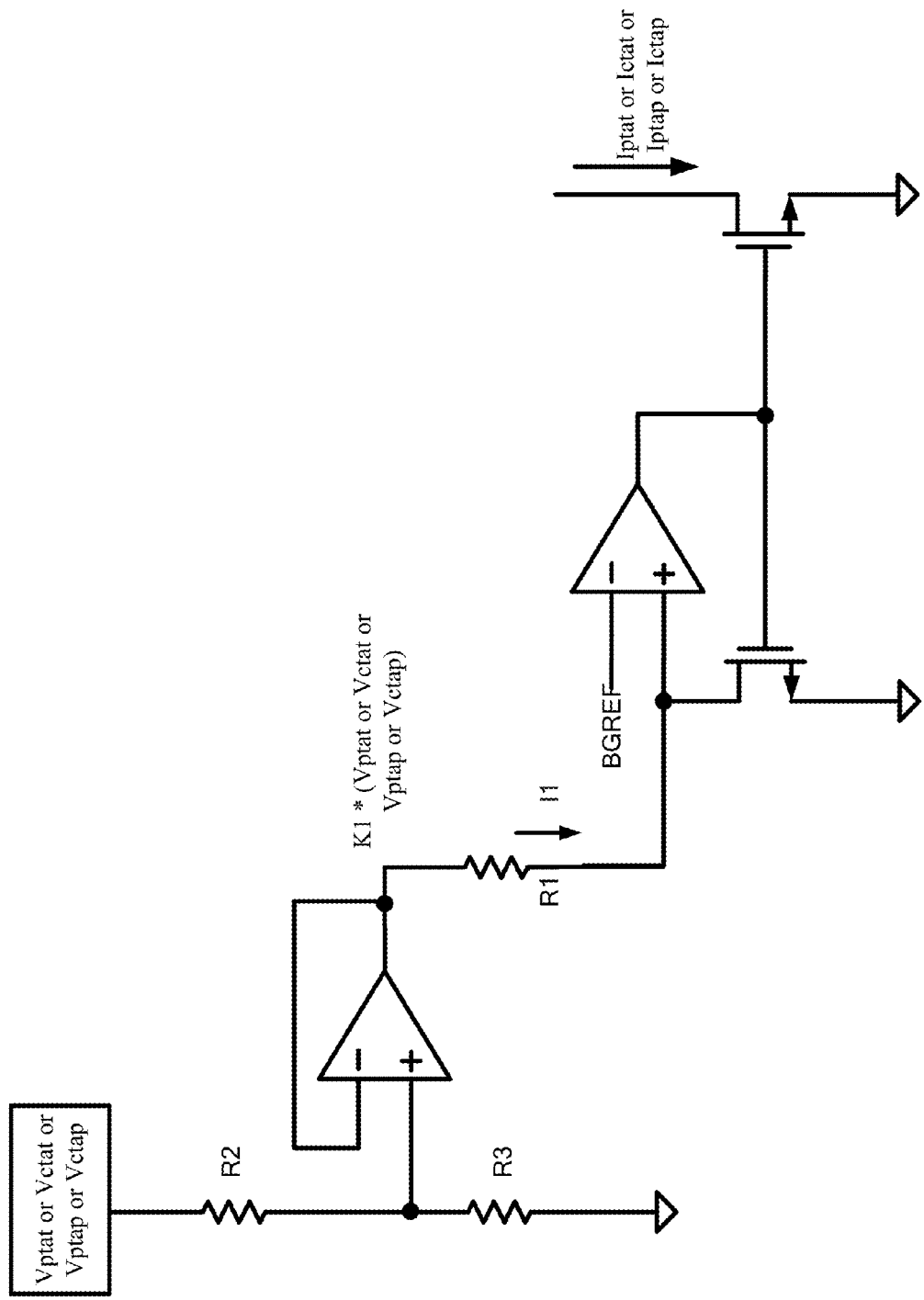
FIG. 13 is a circuit diagram of a first more detailed embodiment of a temperature compensated current generator (part of the current generating block) with a tunable temperature coefficient at a particular current value of the temperature compensated current generator and/or a tunable power coefficient.

FIG. 13 is a circuit diagram of a first more detailed embodiment of a temperature compensated current generator (part of the current generating block) with a tunable temperature coefficient at a particular current value of the temperature compensated current generator and/or a tunable power coefficient.

Figure 14:
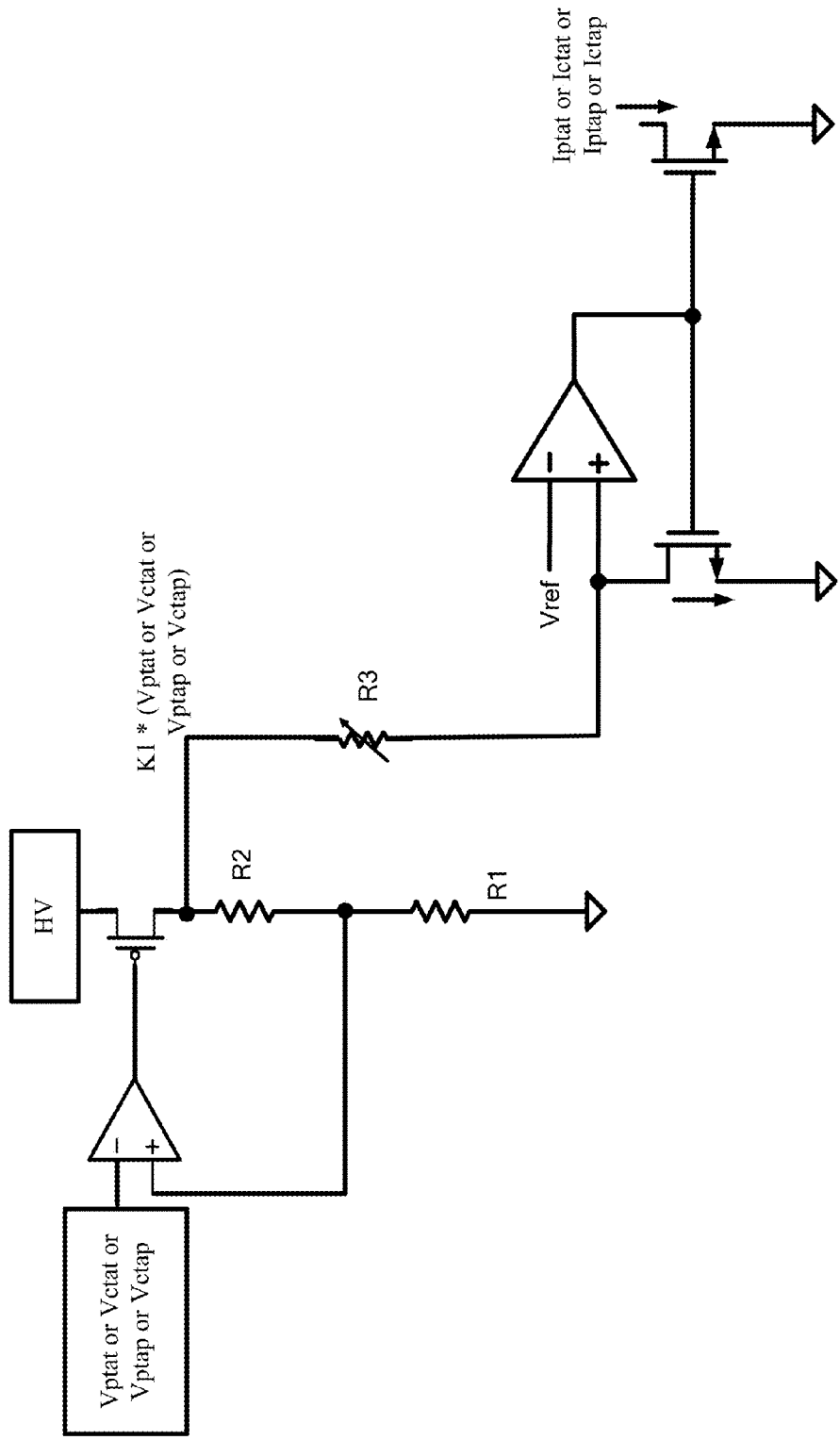
FIG. 14 is a circuit diagram of a second more detailed embodiment of a temperature compensated current generator (part of the current generating block) with a tunable temperature coefficient at a particular current value of the temperature compensated current generator and/or a tunable power coefficient.

FIG. 14 is a circuit diagram of a second more detailed embodiment of a temperature compensated current generator (part of the current generating block) with a tunable temperature coefficient at a particular current value of the temperature compensated current generator and/or a tunable power coefficient.

Figure 15:
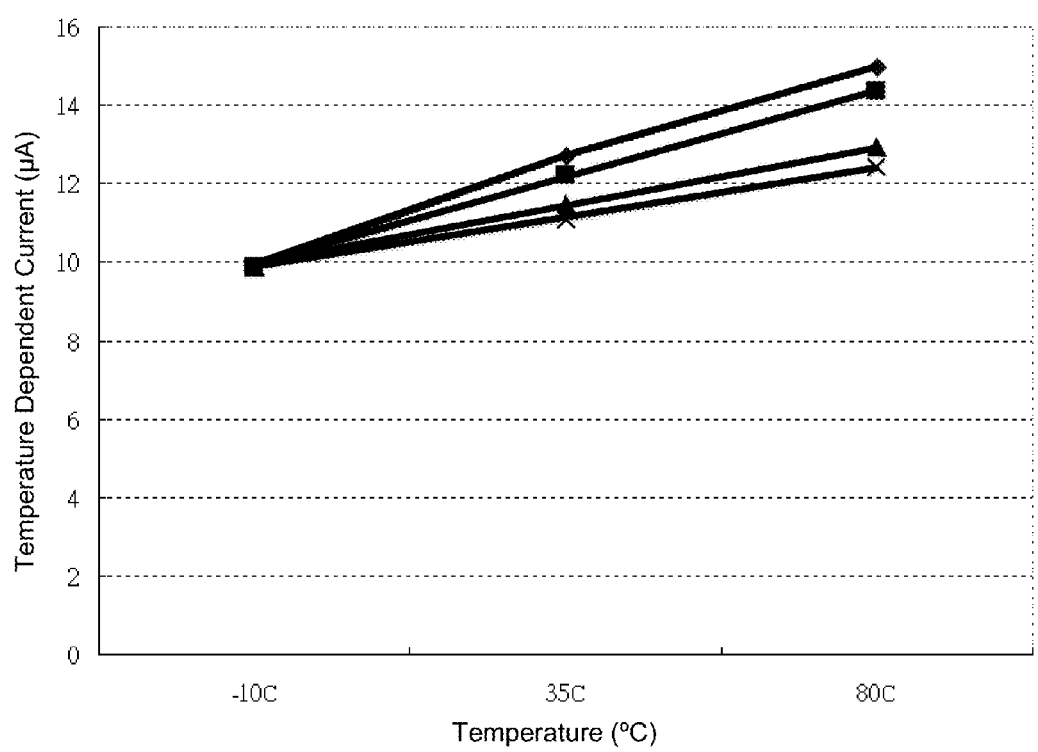
FIG. 15 is a graph showing temperature compensated current versus temperature for various circuit settings.

FIG. 15 is a graph showing temperature compensated current versus temperature for various circuit settings.

Figure 16:
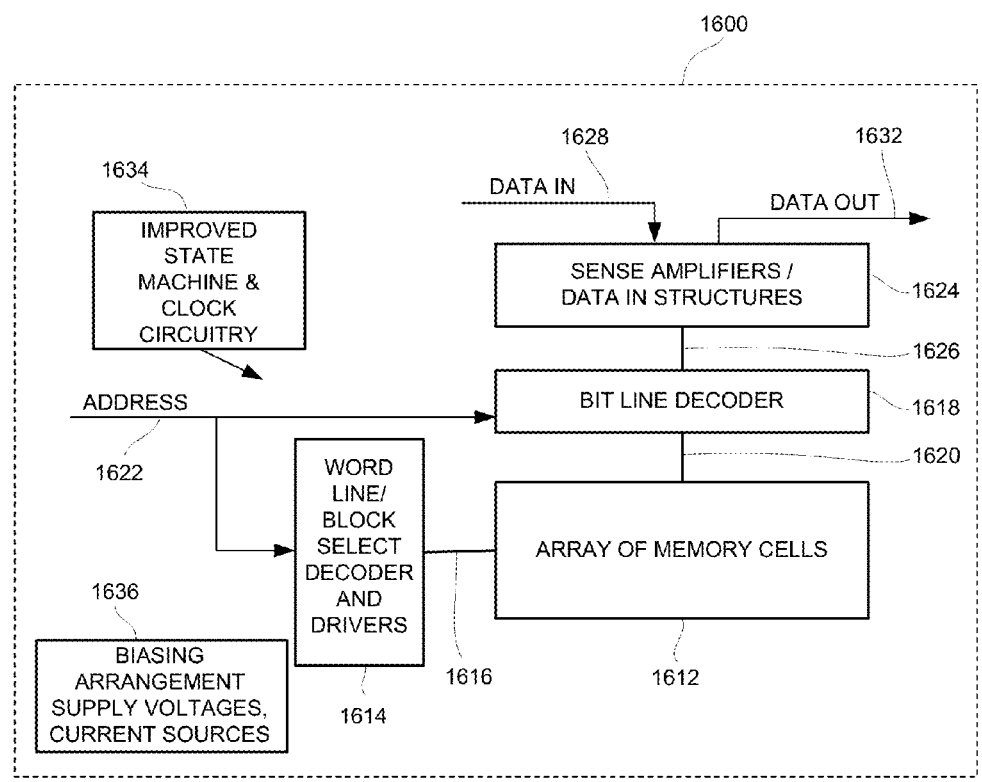
FIG. 16 is block diagram of a memory circuit with an improved integrated clock circuit as discussed herein.

FIG. 16 is block diagram of a memory circuit with an improved integrated clock circuit as discussed herein.

FIG. 16 is a simplified block diagram of an integrated circuit 1600 including a memory array 1612. A word line (or row) and block select decoder 1614 is coupled to, and in electrical communication with, a plurality 1616 of word lines and string select lines, and arranged along rows in the memory array 1612. A bit line (column) decoder and drivers 1618 are coupled to and in electrical communication with a plurality of bit lines 1620 arranged along columns in the memory array 1612 for reading data from, and writing data to, the memory cells in the memory array 1612. Addresses are supplied on bus 1622 to the word line decoder and drivers 1614 and to the bit line decoder 1618. Sense amplifiers and data-in structures in block 1624, including current sources for the read, program and erase modes, are coupled to the bit line decoder 1618 via the bus 1626. Data is supplied via the data-in line 1628 from input/output ports on the integrated circuit 1610, to the data-in structures in block 1624. In the illustrated embodiment, other circuitry 1630 is included on the integrated circuit 1600, such as a general purpose processor or special purpose application circuitry, or a combination of modules providing system-on-a-chip functionality supported by the memory cell array. Data is supplied via the data-out line 1632 from the sense amplifiers in block 1624 to input/output ports on the integrated circuit 1600, or to other data destinations internal or external to the integrated circuit 1600. State machine and improved clock circuitry (as discussed herein) are in circuitry 1634, controlling biasing arrangement supply voltages and current sources 1636. In various embodiments, the circuitry 1634 has a temperature dependent current generator that has an adjustable temperature coefficient, such that a range of temperature coefficients is selectable at a particular current output. In various embodiments, the circuitry 1634 has multiple copies or scaled versions of a current that controls a discharging rate and/or a charging rate between reference signals of timing circuitry.

Figure 17:
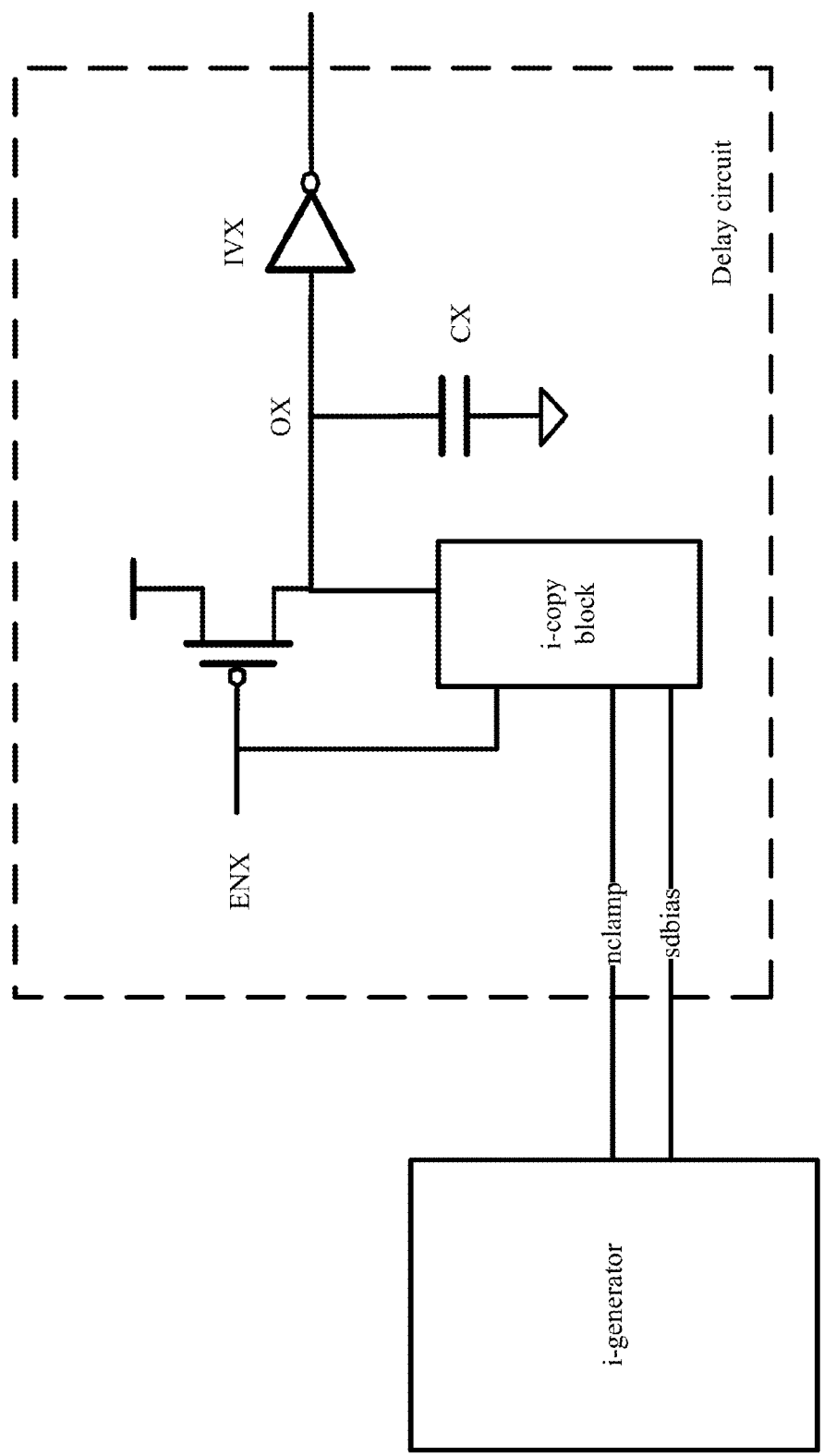
FIG. 17 is block diagram of a delay circuit with the delay time determined by a reference current of a current generator.

FIG. 17 is block diagram of a delay circuit with the delay time determined by a reference current of a current generator.

The delay circuit resembles a pared down version of the clock circuit of FIG. 2. The delay circuit generally charges to or discharges from capacitance CX, to change the output voltage at OX. The rate at which the delay circuit output rises and/or falls, is determined by a current generated by the i-generator block. This current generated by the current generator, or i-generator, block is copied or scaled into the delay circuit by the current mirroring, or i-copy, block.

In one embodiment, the capacitance CX is actually a PMOS transistor with the opposite terminal decoupled from a common ground with the inverter.

In another embodiment the capacitance CX is coupled to a common power.

The inverter circuit can be driven by circuit power source or a regulated power source which is CTAT_power (power that is conversely proportional to temperature). In another embodiment, the inverter circuit is driven by a source of PTAT_power (power that is proportional to temperature). In another embodiment, the inverter circuity 204A and 204B is driven by a source of constant power that is independent of temperature.

The inverter circuit can be driven by power source which is CTAP_power (power that is conversely proportional to circuit power). In another embodiment, the inverter circuit is driven by a source of PTAP_power (power that is proportional to circuit power). In another embodiment, the inverter circuit is driven by a source of constant power that is independent of circuit power.

The power of the inverter is controlled, to change the trip point of the inverter and thereby detect the delay circuit output.

The inverter is advantageous, for one or more of the following reasons: (1) low working VDD; (2) small circuit size (inverter has only 2 MOSFETs, but the op amp has 5 or more MOSFETs); (3) simple design; (4) low active current (inverter has one current path, and does not require an extra current mirror in the inverter); and (5) high speed (inverter has one stage delay).

Figure 18:
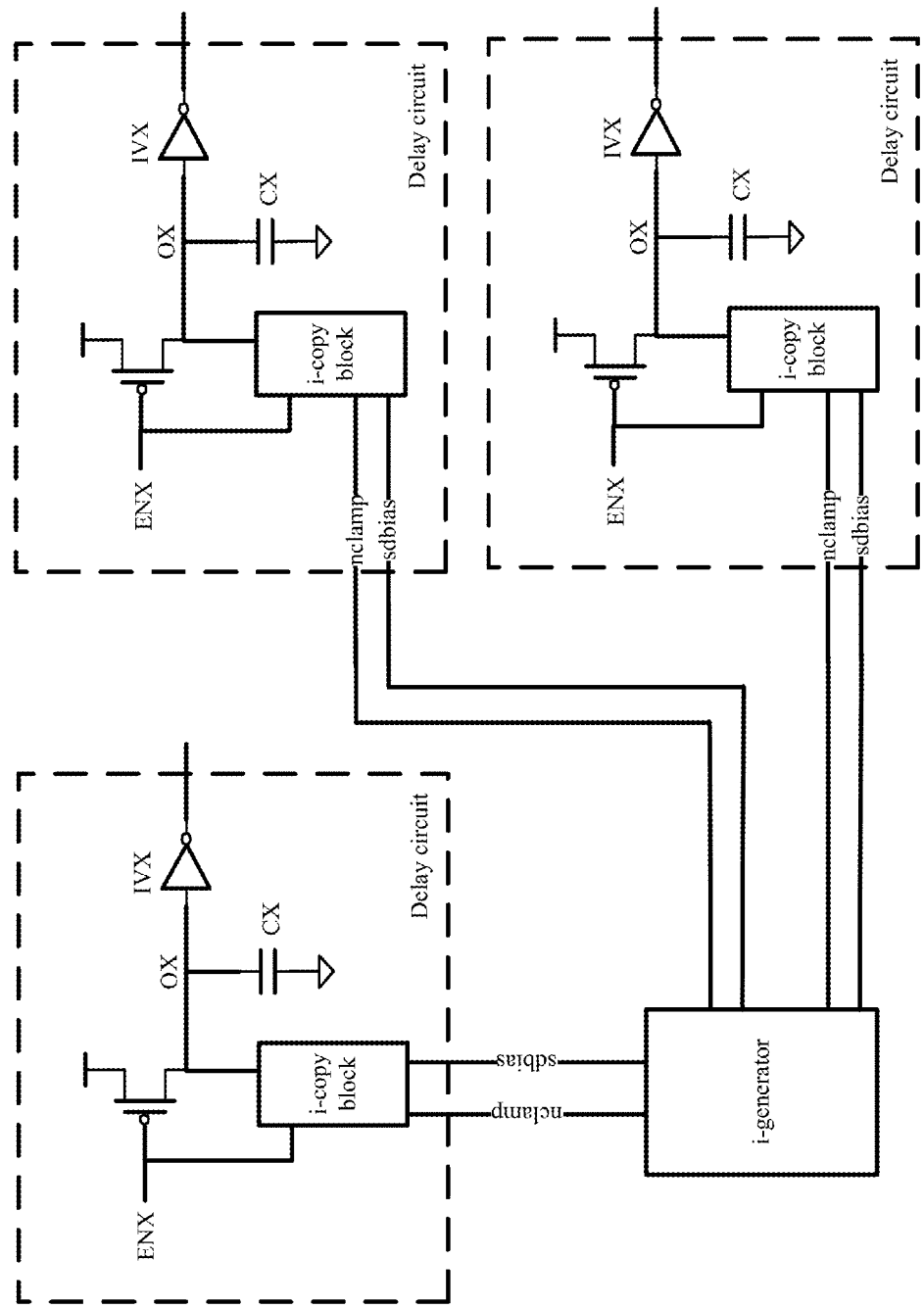
FIG. 18 is block diagram of a shared current generator that determines the delay times of multiple delay circuits.

FIG. 18 is block diagram of a shared current generator that determines the delay times of multiple delay circuits.

The delay system of FIG. 18 is similar to the delay system of FIG. 17. However, whereas the delay system of FIG. 17 couples the i-generator to a single delay circuit, the delay system of FIG. 18 couples the i-generator to multiple delay circuits. The delay circuit system of FIG. 18 allows adjustment of the delay time of multiple delay circuits at different locations of the integrated circuit by changing the reference current of the i-generator. For example, the reference current of the i-generator can be varied by controlling trim registers that vary the magnitude of the reference current, such that varying the trim registers adjusts the delay times of all of the multiple delay circuits that rely on the reference current of the i-generator. Otherwise, the adjustment of the delay time of multiple delay circuits at different locations of the integrated circuit would require individual adjustment of each of the multiple delay circuits.

Although the same current reference is shared among the multiple delay circuits, the multiple delay circuits can generate the same delay time or varied delay times. In some embodiments, the delay time is varied among the multiple delay circuits by varying the current mirror ratio of the multiple delay circuits. For example, the multiple delay circuits can vary the ratio of transistor widths in the i-copy block of FIG. 4 to the transistor widths in the i-generator block of FIG. 3. In other examples, multiple individual current mirror transistors are connected in parallel. Also, the capacitance can be varied, such as capacitance CX in FIG. 17

Figure 19:
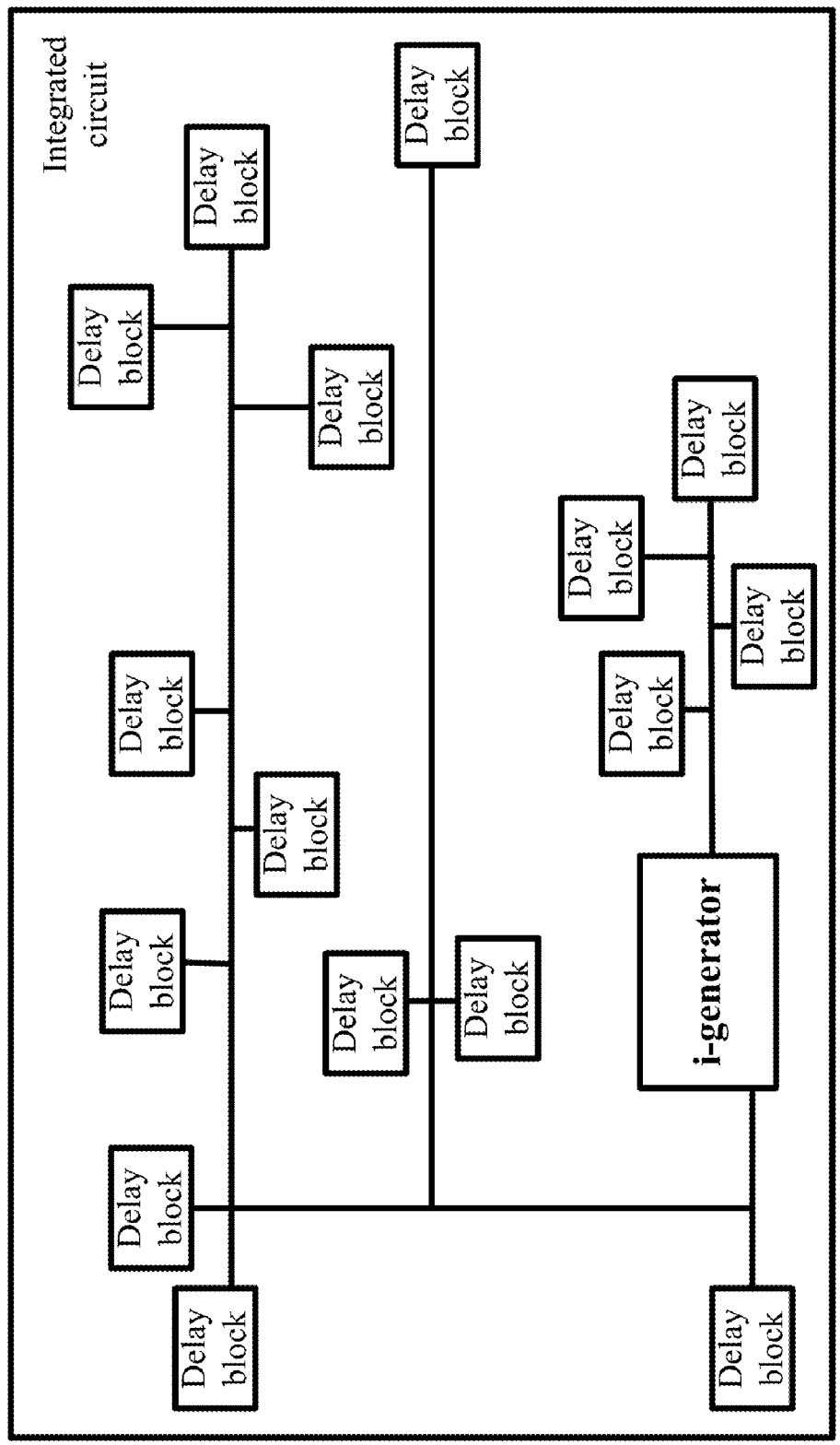
FIG. 19 is another block diagram of a shared current generator that determines the delay times of multiple delay circuits.
Figure 20:
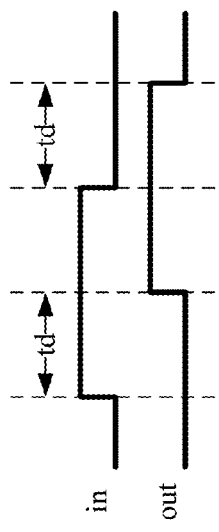
FIGS. 20-23 are block diagrams of circuits incorporating the delay circuit with the delay time determined by a reference current of a current generator.
Figure 24:
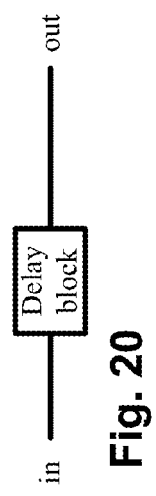
FIGS. 24-27 are timing diagrams with voltage traces of the input and output corresponding to the various delay circuits of FIGS. 20-23.
Figure 21:
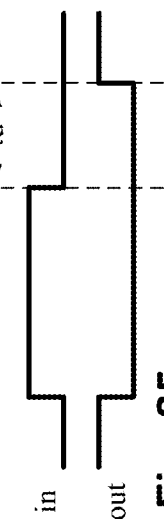
Figure 25:
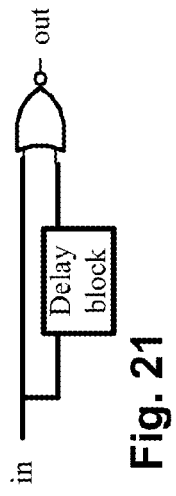
Figure 22:
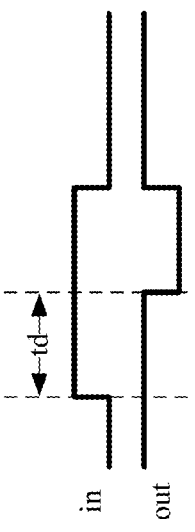
Figure 26:
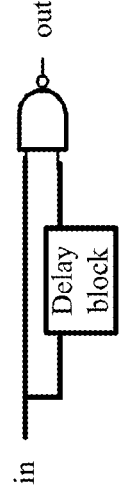
Figure 23:
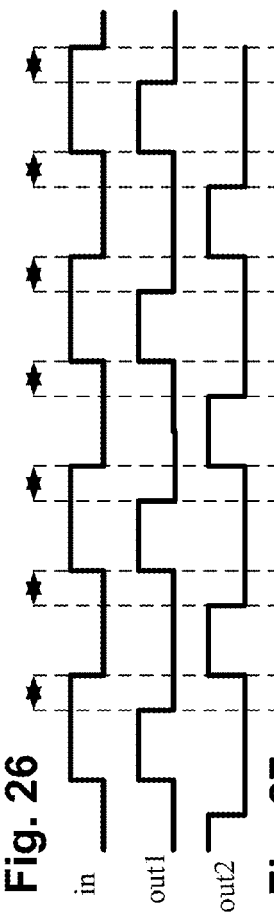
Figure 27:
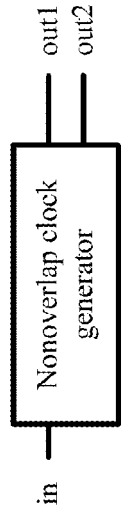

FIG. 19 is another block diagram of a shared current generator that determines the delay times of multiple delay circuits. As with FIG. 18, a single i-generator controls the reference current which determines the delay times of multiple delay circuits. Each of the delay blocks can have the same delay circuit or different delay circuits. Examples of different delay circuits are disclosed by FIGS. 20-27.

FIGS. 20-23 are block diagrams of circuits incorporating the delay circuit with the delay time determined by a reference current of a current generator.

FIGS. 24-27 are timing diagrams with voltage traces of the input and output corresponding to the various delay circuits of FIGS. 20-23.

Figure 28:
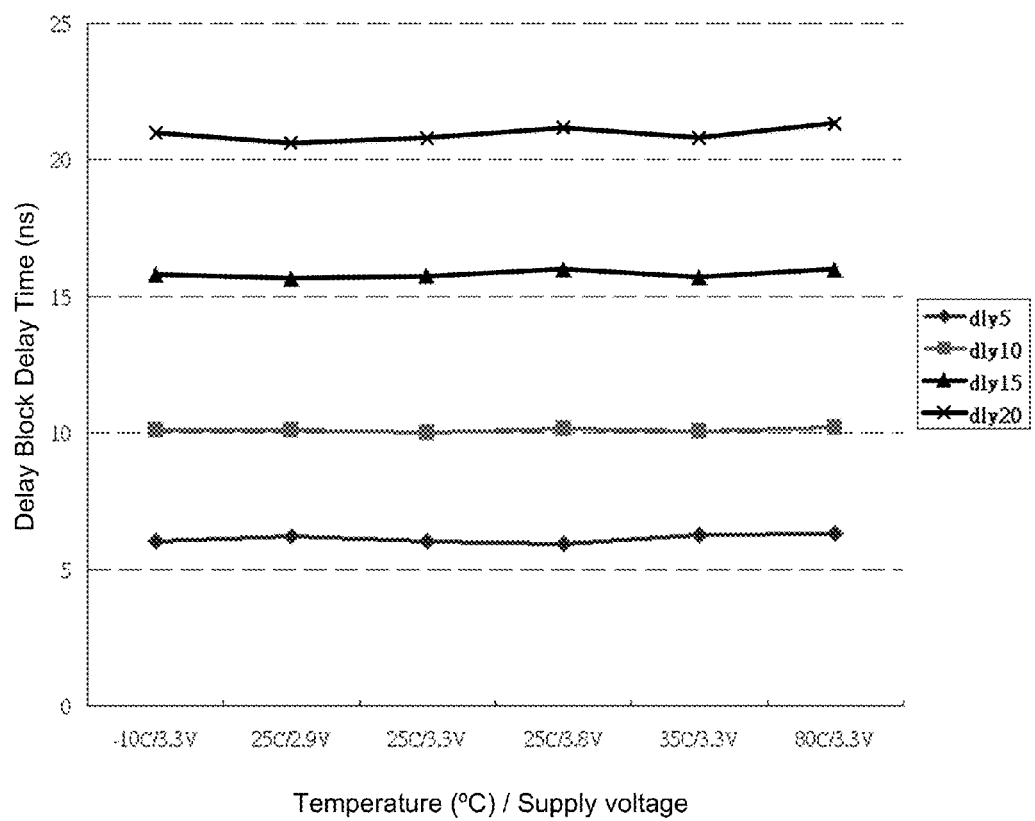
FIG. 28 is a graph showing temperature compensated and circuit power compensated delay times generated by various delay blocks.

FIG. 28 is a graph showing temperature compensated and circuit power compensated delay times generated by various delay blocks.

Delay circuits that generate different delays are simulated under various combinations of temperature and circuit power. The different delay circuits are a 5 nanosecond delay circuit, a 10 nanosecond delay circuit, a 15 nanosecond delay circuit, and a 20 nanosecond delay circuit. The various combinations simulated are: −10 degrees Celsius and 3.3 V circuit power, 25 degrees Celsius and 2.9 V circuit power, 25 degrees Celsius and 3.3 V circuit power, 25 degrees Celsius and 3.8 V circuit power, 35 degrees Celsius and 3.3 V circuit power, 80 degrees Celsius and 3.3 V circuit power. The simulated results show uniform performance of each delay circuit across the various combinations of temperature and circuit power.

The delay time is controlled in various ways. The current mirror ratio is changed, such as by changing the width of the individual current mirror transistors, or connecting in parallel multiple individual current mirror transistors. Also, the capacitance can be varied, such as capacitance CX in FIG. 17.

Figure 29:
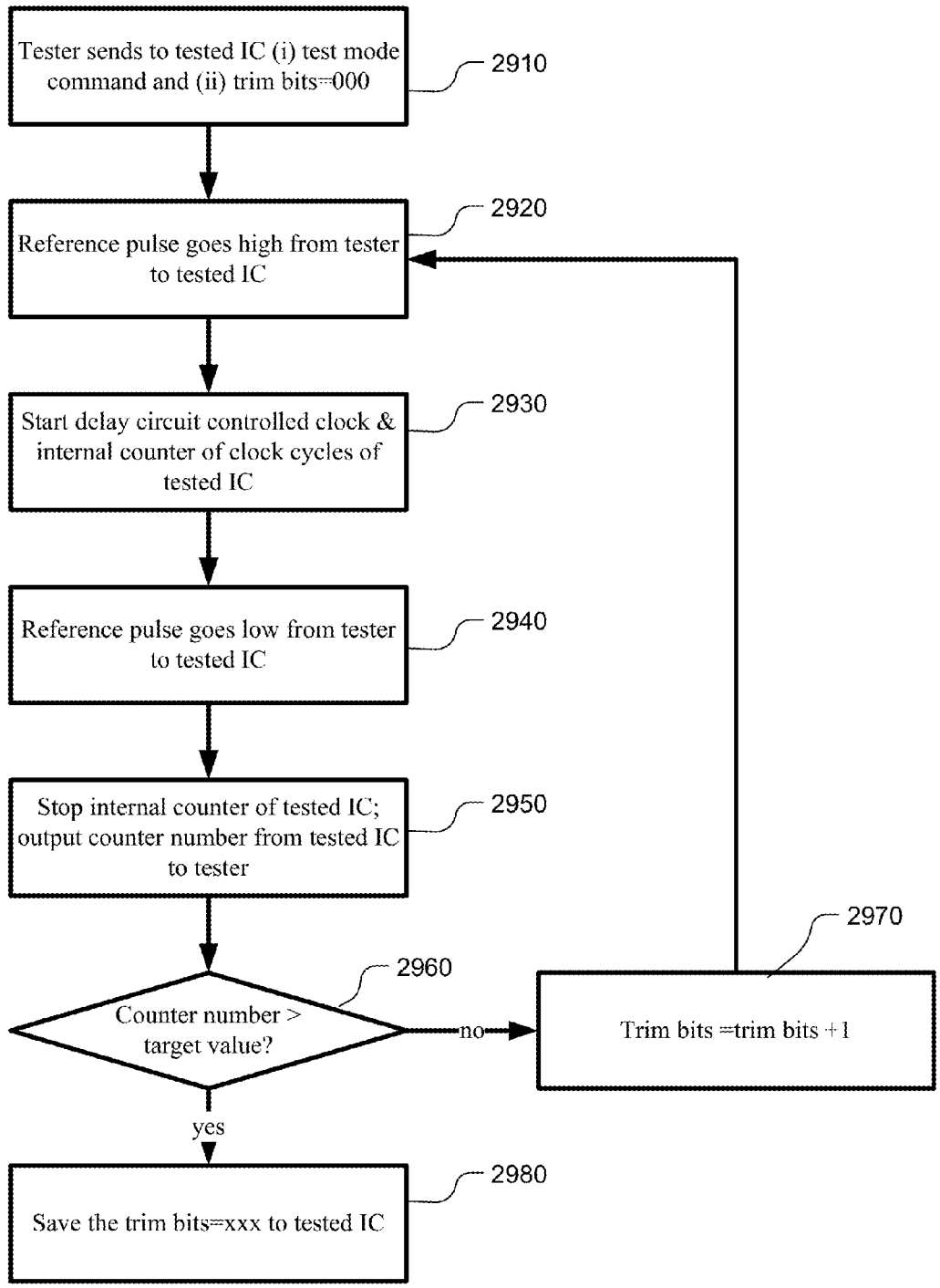
FIG. 29 is a process flow of a tester that automatically tunes the delay times of multiple delay blocks with a single set of trim registers on an integrated circuit.

FIG. 29 is a process flow of a tester that automatically tunes the delay times of multiple delay blocks with a single set of trim registers on an integrated circuit.

In 2910, the tester sends to tested IC both (i) test mode command, and (ii) trim bits=000. The trim bits control the magnitude of the reference current of the delay circuits. In 2920, the reference pulse goes high from tester to tested IC. In 2930, responsive to the high reference pulse from the tester, the tested IC starts its delay circuit controlled clock (with period controlled by the trim bits) and the tested IC starts the internal counter of clock cycles. In 2940, the reference pulse goes low from tester to tested IC. In 2950, responsive to the low reference pulse from the tester, the tested IC stop the internal counter, and outputs the counter number from the tested IC to the tester. In 2960, In 2970, the tester determines whether the counter number exceeds the target value of counted clock cycles. If not, then the clock is too slow, and the tester determines that the trim bits in the tested IC are to be adjusted to speed up the clock or other delay circuit(s) of the tested IC controlled by the reference current. Increasing the trim bits increases the reference current and shortens then delay of the delay circuits controlled by the trim bitus. In 2980, the tester increments the trim bits value stored by the tested IC, and the process returns to 2920. On the other hand, if the tester in 2970 tester determines that the counter number does exceed the target value of counted clock cycles, then the tester stores the present value of trim bits with the tested IC.

Figure 30:
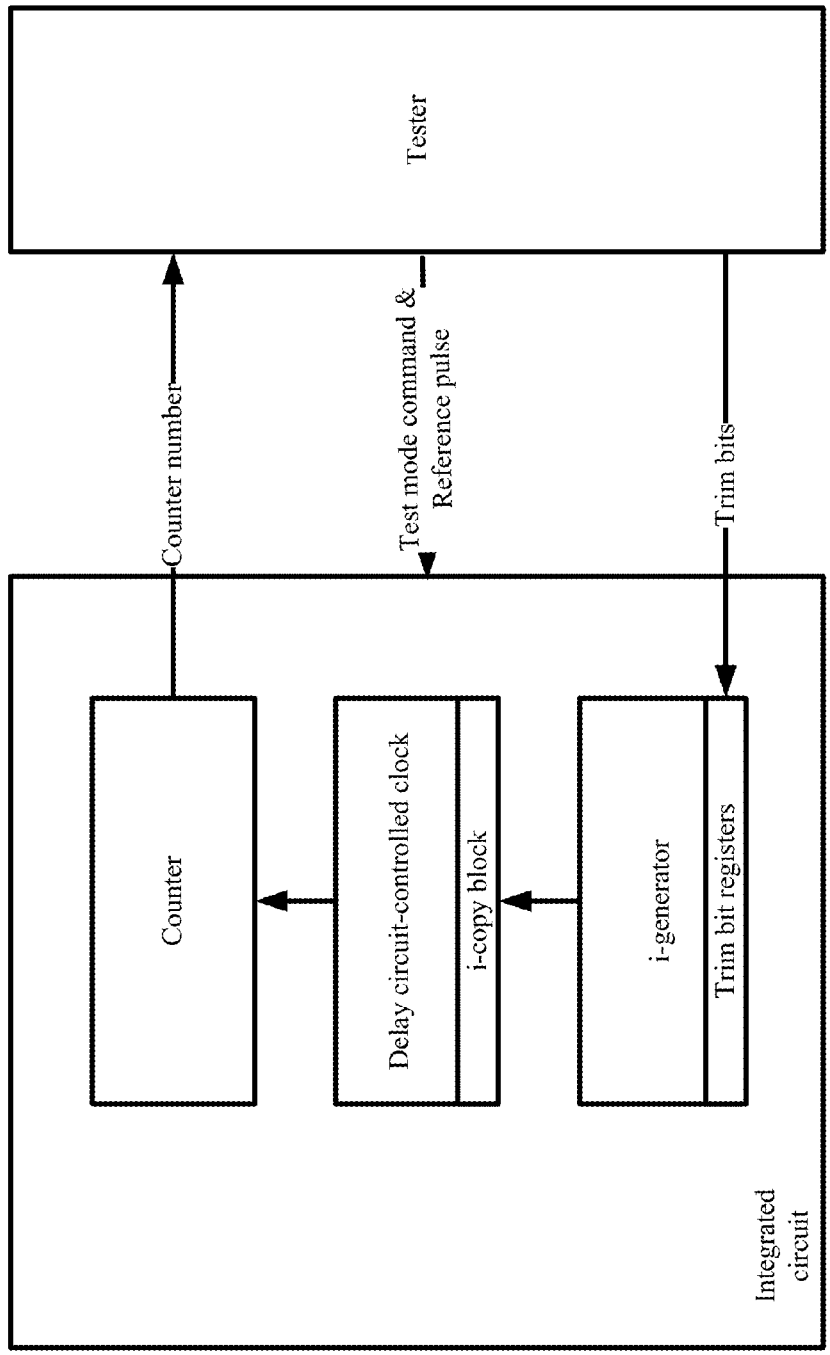
FIG. 30 is a block diagram of a test system that automatically tunes the delay times of multiple delay blocks with a single set of trim registers on an integrated circuit.

FIG. 30 is a block diagram of a test system that automatically tunes the delay times of multiple delay blocks with a single set of trim registers on an integrated circuit.

The tester is coupled to the IC under test. The tester sends a test mode command to initiate automatic trimming of the delay circuits. The tester also send high and low reference pulses to begin and end the counter of a clock with a delay circuit having a delay time that is controlled by the reference current. The IC under test has an i-generator with trim bit registers that control the magnitude of the reference current. The IC under test also includes a counter that counts a number of the clock cycles responsive to the reference pulse from the tester.

Figure 31:
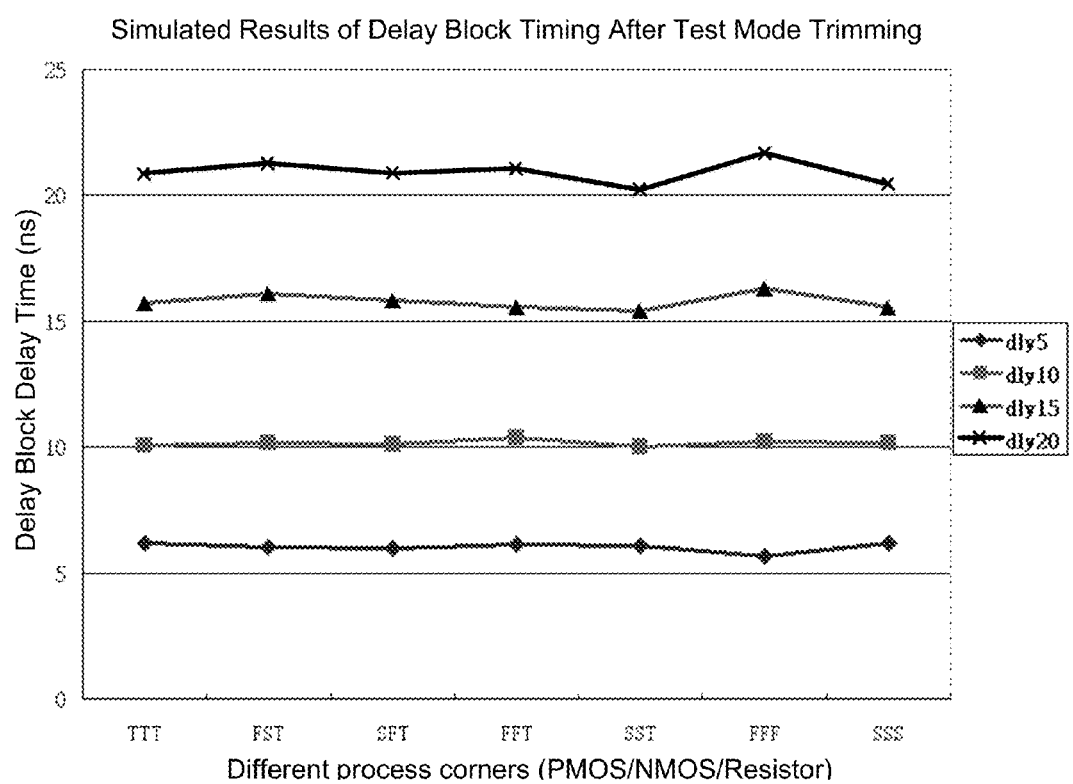
FIG. 31 is a graph showing delay times generated by various delay blocks under different process corners.

FIG. 31 is a graph showing delay times generated by various delay blocks under different process corners.

Delay circuits that generate different delays are simulated under various process corners after the automatic test mode trimming disclosed by FIGS. 29 and 30. The simulated results show uniform performance of each delay circuit across the various process corners, such as variation in NMOS threshold voltage, PMOSD threshold voltage, and resistance variation.

The delay time is controlled in various ways. The current mirror ratio is changed, such as by changing the width of the individual current mirror transistors, or connecting in parallel multiple individual current mirror transistors. Also, the capacitance can be varied, such as capacitance CX in FIG. 17.

Figure 32:
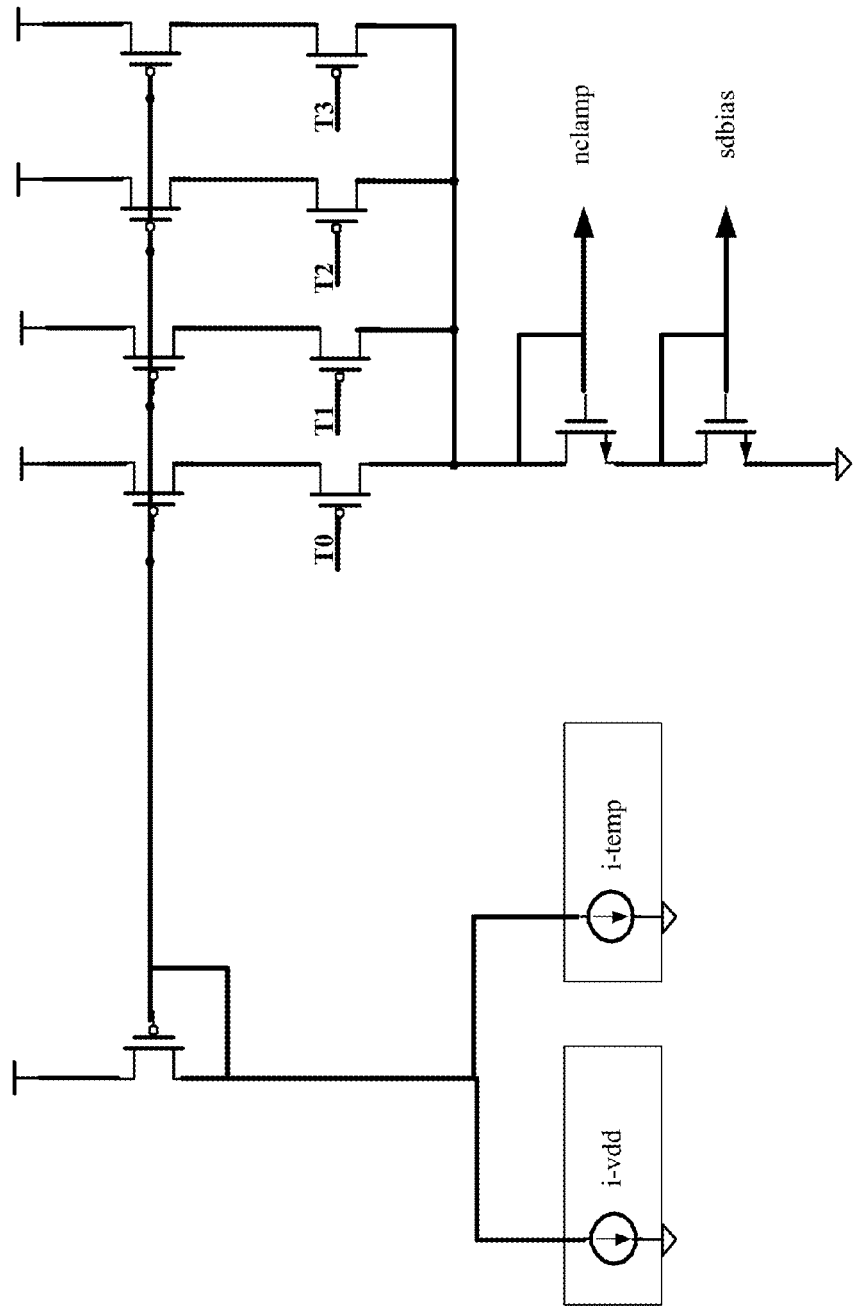
FIG. 32 is a circuit diagram of the current generating circuit, which generates a current that controls the discharging rate and/or the charging rate between reference signals of timing circuitry, and with trimming circuitry.

FIG. 32 is a circuit diagram of the current generating circuit, which generates a current that controls the discharging rate and/or the charging rate between reference signals of timing circuitry, and with trimming circuitry.

The current generating circuit of FIG. 32 is similar to the current generating circuit of FIG. 3. However, the current generating circuit of FIG. 32 also adds an example of trimming circuitry. In this example, trim bit signals T0-T3 from trim bit registers vary the output current of the current mirror by turning on or off transistors controlling multiple components of current to be added together in the current mirror output. An example application is the current generator in FIG. 30.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
an integrated circuit generating a clock signal, comprising:
timing circuitry having an output alternating between reference signals;
a current generating block with an output current that controls at least one of: (i) a discharging rate between the reference signals, and (ii) a charging rate between the reference signals;
a plurality of current mirroring blocks that generate multiple versions of the output current of the current generating block, the multiple versions controlling at least one of the discharging rate and the charging rate at different parts of the timing circuitry; and
a level switching circuit coupled to the output of the timing circuitry, the level switching circuit having an output that determines the clock signal of the integrated circuit, wherein the output of the level switching circuit switches output levels in response to the output of the timing circuitry reaching a trigger point of the level switching circuit.

2. The apparatus of claim 1, wherein the timing circuitry and the level switching circuit determine timing of the clock signal.

3. The apparatus of claim 1, wherein the output current of the current generating block includes at least (i) a circuit power compensated component and (ii) a temperature compensated component.

4. The apparatus of claim 1, wherein the output current of the current generating block includes at least (i) a circuit power compensated component having a tunable power coefficient, the circuit power compensated component being at least one of proportional to circuit power, conversely proportional to circuit power, and independent of circuit power; and (ii) a temperature compensated component having a tunable temperature coefficient, the temperature compensated component being at least one of proportional to temperature, conversely proportional to temperature, and independent of temperature.

5. The apparatus of claim 1, wherein the output current of the current generating block includes at least a circuit power compensated component having a tunable power coefficient, the circuit power compensated component being at least one of proportional to circuit power, conversely proportional to circuit power, and independent of circuit power.

6. The apparatus of claim 1, wherein the output current of the current generating block includes at least a temperature compensated component having a tunable temperature coefficient, the temperature compensated component being at least one of proportional to temperature, conversely proportional to temperature, and independent of temperature.

7. The apparatus of claim 1, wherein the output current of the current generating block includes at least (i) a temperature compensated component and (ii) a circuit power compensated component having a tunable power coefficient, the circuit power compensated component being at least one of proportional to circuit power, conversely proportional to circuit power, and independent of circuit power.

8. The apparatus of claim 1, wherein the output current of the current generating block includes at least (i) a circuit power compensated component and (ii) a temperature compensated component having a tunable temperature coefficient, the temperature compensated component being at least one of proportional to temperature, conversely proportional to temperature, and independent of temperature.

9. The apparatus of claim 1, wherein the multiple versions of the output current scale the output current.

10. The apparatus of claim 1, further comprising:
a latch receiving the output of the level switching circuitry and generating the clock signal of the integrated circuit, the latch including cross-coupled gates, such that outputs of the cross-coupled gates in the latch are coupled to inputs of different cross-coupled gates in the latch, the latch having a plurality of inputs coupled to the different parts of the timing circuitry.

11. A method of generating a clock signal from an integrated circuit, comprising:
alternating an output of timing circuitry between reference signals;
generating a current that controls at least one of (i) a discharging rate between the reference signals and (ii) a charging rate between the reference signals;
generating multiple versions of the current controlling at least one of the discharging rate and the charging rate at different parts of the timing circuitry, the multiple versions controlling at least one of the discharging rate and the charging rate at different parts of the timing circuitry; and
switching output levels of level switching circuitry in response to the output of the timing circuitry reaching a trigger point of the level switching circuit, an output of the level switching circuitry determining the clock signal of the integrated circuit.

12. The method of claim 11, wherein the timing circuitry and the level switching circuit determine timing of the clock signal.

13. The method of claim 11, wherein the current controlling at least one of the discharging rate and the charging rate, includes at least (i) a circuit power compensated component and (ii) a temperature compensated component.

14. The method of claim 11, wherein the current controlling at least one of the discharging rate and the charging rate, includes at least (i) a circuit power compensated component having a tunable power coefficient, the circuit power compensated component being at least one of proportional to circuit power, conversely proportional to circuit power, and independent of circuit power; and (ii) a temperature compensated component having a tunable temperature coefficient, the temperature compensated component being at least one of proportional to temperature, conversely proportional to temperature, and independent of temperature.

15. The method of claim 11, wherein the current controlling at least one of the discharging rate and the charging rate, includes at least a circuit power compensated component having a tunable power coefficient, the circuit power compensated component being at least one of proportional to circuit power, conversely proportional to circuit power, and independent of circuit power.

16. The method of claim 11, wherein the wherein the current controlling at least one of the discharging rate and the charging rate, includes at least a temperature compensated component having a tunable temperature coefficient, the temperature compensated component being at least one of proportional to temperature, conversely proportional to temperature, and independent of temperature.

17. The method of claim 11, wherein the current controlling at least one of the discharging rate and the charging rate, includes at least (i) a temperature compensated component and (ii) a circuit power compensated component having a tunable power coefficient, the circuit power compensated component being at least one of proportional to circuit power, conversely proportional to circuit power, and independent of circuit power.

18. The method of claim 11, wherein the current controlling at least one of the discharging rate and the charging rate, includes at least (i) a circuit power compensated component and (ii) a temperature compensated component having a tunable temperature coefficient, the temperature compensated component being at least one of proportional to temperature, conversely proportional to temperature, and independent of temperature.

19. The method of claim 11, wherein the multiple versions scale the current controlling at least one of the discharging rate and the charging rate.

20. The method of claim 11, further comprising:
generating the clock signal of the integrated circuit with a latch receiving the output of the level switching circuitry, the latch including cross-coupled gates, such that outputs of the cross-coupled gates in the latch are coupled to inputs of different cross-coupled gates in the latch, the latch having a plurality of inputs coupled to the different parts of the timing circuitry.

21. An apparatus, comprising:
an integrated circuit generating a delay signal, comprising:
delay circuitry having an output switching between reference signals;
a current generating block with an output current that controls at least one of: (i) a discharging rate between the reference signals, and (ii) a charging rate between the reference signals;
a current mirroring block that generates a version of the output current of the current generating block, the version controlling at least one of the discharging rate and the charging rate of the delay circuitry; and
a level switching circuit coupled to the output of the delay circuitry, the level switching circuit having an output that determines the delay signal of the integrated circuit, wherein the output of the level switching circuit switches output levels in response to the output of the delay circuitry reaching a trigger point of the level switching circuit.

22. The apparatus of claim 21, wherein the integrated circuit generates a plurality of delay signals including the delay signal, and the apparatus further comprises:
a plurality of delay circuits generating the plurality of delay signals, each of plurality of delay circuits including:

the delay circuitry having an output switching between the reference signals;

the current mirroring block that generates the version of the output current of the current generating block, the version controlling at least one of the discharging rate and the charging rate of the delay circuitry; and the level switching circuit coupled to the output of the delay circuitry, the level switching circuit having the output that determines the delay signal of the plurality of delay signals, wherein the output of the level switching circuit switches output levels in response to the output of the delay circuitry reaching a trigger point of the level switching circuit.

23. The apparatus of claim 22, wherein the current mirroring blocks in the plurality of delay circuits make scaled versions of the output current of the current generating block, wherein particular current magnitudes values of the scaled versions result in corresponding delay times of the plurality of delay signals.

24. The apparatus of claim 22, wherein the integrated circuit further includes:

a set of memory registers controlling a magnitude of the output current of the current generating block.

25. The apparatus of claim 24, wherein the set of memory registers controls delay times of the plurality of delay signals generated by the plurality of delay circuits.

26. The apparatus of claim 24, wherein the integrated circuit has a test mode that outputs a clock cycle count with a total that varies with the set of memory registers.

27. The apparatus of claim 24, wherein the integrated circuit has a test mode that varies the set of memory registers to compensate for different process corners during manufacture.

* * * * *